United States Patent
Sunohara

(10) Patent No.: US 7,507,602 B2
(45) Date of Patent: Mar. 24, 2009

(54) SEMICONDUCTOR DEVICE AND METHOD OF MANUFACTURING THE SAME

(75) Inventor: Masahiro Sunohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 636 days.

(21) Appl. No.: 11/138,418

(22) Filed: May 27, 2005

(65) Prior Publication Data

US 2005/0212126 A1 Sep. 29, 2005

Related U.S. Application Data

(62) Division of application No. 10/698,940, filed on Nov. 3, 2003, now Pat. No. 6,958,544.

(30) Foreign Application Priority Data

Nov. 5, 2002 (JP) ............................. 2002-320980

(51) Int. Cl.
*H01L 21/00* (2006.01)
(52) U.S. Cl. ................. 438/108; 257/E21.503
(58) Field of Classification Search ................. 438/108; 257/E21.503
See application file for complete search history.

(56) References Cited

U.S. PATENT DOCUMENTS

| | | | |
|---|---|---|---|
| 6,459,152 B1 * | 10/2002 | Tomita et al. ................ | 257/738 |
| 6,548,330 B1 | 4/2003 | Murayama et al. .......... | 438/127 |
| 6,582,991 B1 | 6/2003 | Maeda et al. ............... | 438/107 |
| 6,608,371 B2 | 8/2003 | Kurashima et al. .......... | 257/686 |
| 6,784,530 B2 * | 8/2004 | Sugaya et al. ............... | 257/686 |
| 6,870,248 B1 * | 3/2005 | Shibata ........................ | 257/686 |
| 2001/0004130 A1 | 6/2001 | Higashi et al. .............. | 257/686 |
| 2001/0008794 A1 | 7/2001 | Akagawa ..................... | 438/620 |
| 2002/0004288 A1 | 1/2002 | Nishiyama ................... | 438/464 |
| 2002/0127839 A1 | 9/2002 | Umetsu et al. .............. | 438/618 |

FOREIGN PATENT DOCUMENTS

| | | |
|---|---|---|
| EP | 1094511 A2 | 4/2001 |
| EP | 1137066 A2 | 9/2001 |
| EP | 1154474 A1 | 11/2001 |
| EP | 1189272 A1 | 3/2002 |
| EP | 1189273 A2 | 3/2002 |

(Continued)

OTHER PUBLICATIONS

European Search Report dated Apr. 15, 2004.

(Continued)

*Primary Examiner*—W. David Coleman
(74) *Attorney, Agent, or Firm*—Kratz, Quintos & Hanson, LLP

(57) ABSTRACT

There are included the steps of preparing a wiring substrate having a wiring pattern on a surface, bonding a connection terminal of electronic chip, which has a predetermined element and the connection terminal on one surface, to the wiring pattern of the wiring substrate by a flip-chip bonding, forming an insulating film on the wiring substrate to have a film thickness that covers the electronic chip, or a film thickness that exposes at least another surface of the electronic chip, and reducing a thickness of the electronic chip by grinding another surface of the electronic chip and the insulating film.

15 Claims, 15 Drawing Sheets

FOREIGN PATENT DOCUMENTS

| | | |
|---|---|---|
| EP | 1248295 A2 | 10/2002 |
| JP | 2001-323645 | 11/2000 |
| JP | 2001-144218 | 5/2001 |
| JP | 2001-168269 | 6/2001 |
| JP | 2001-177045 | 6/2001 |
| JP | 2001-196525 | 7/2001 |
| JP | 2001-313350 | 11/2001 |
| JP | 2002-026240 | 1/2002 |
| JP | 2002-050738 | 2/2002 |
| JP | 2002-184796 | 6/2002 |
| JP | 2002-305282 | 10/2002 |

OTHER PUBLICATIONS

Abstract—03256994.9.
Japanese Office Action and partial translation dated May 29, 2007.
Japanese Office Action dated Oct. 9, 2007 and English translation.

* cited by examiner

SEMICONDUCTOR DEVICE AND METHOD OF MANUFACTURING THE SAME

CROSS REFERENCE TO RELATED APPLICATION

This application is a division of Ser. No. 10,698,940, filed Nov. 3, 2003 now U.S. Pat. No. 6,958,544, which is based on Japanese Application No. 2002-320980 filed Nov. 5, 2002.

BACKGROUND OF THE INVENTION

1. Field of the Invention

The present invention relates to a semiconductor device and a method of manufacturing the same and, more particularly, a semiconductor device in which semiconductor chips, etc. are three-dimensionally packaged and a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

In reply to the request of further higher density, the multichip package (semiconductor device) in which a plurality of semiconductor chips are laminated three-dimensionally on the substrate and packaged has been developed. As an example, in Patent Application Publication (KOKAI) 2001-196525 (Patent Literature 1), Patent Application Publication (KOKAI) 2001-177045 (Patent Literature 2), and Patent Application Publication (KOKAI) 2000-323645 (Patent Literature 3), the semiconductor device having the structure in which a plurality of semiconductor chips are laminated on the wiring substrate is set forth.

In recent years, in such multichip package, there is such a request that an overall thickness should be reduced. Therefore, individual semiconductor chips must be formed as thin as possible and be packaged.

As the related art 1 to get the thinned semiconductor chip, first a thickness of the semiconductor wafer is reduced up to 100 μm or less, for example, by grinding the back surface of the semiconductor wafer by means of the grinder in a state that the first protection tape is adhered onto the element formation surface of the semiconductor wafer on which predetermined elements are formed to support. Then, the grinding surface of the semiconductor wafer is adhered onto the second protection tape and then the first protection tape is stripped off from the semiconductor wafer. Then, individual thinned semiconductor chips are obtained by applying the dicing to the semiconductor wafer on the second protection tape.

Also, as the related art 2, first a rigid glass substrate is adhered onto the element formation surface of the semiconductor wafer, and then a thickness of the semiconductor wafer is reduced by grinding the back surface of the semiconductor wafer by virtue of the grinder. Then, the semiconductor wafer is peeled off from the glass substrate, and then individual thinned semiconductor chips are obtained by applying the dicing to the semiconductor wafer.

In addition, as the related art 3, first the element formation surfaces of two semiconductor wafers, on which predetermined elements are formed respectively, are electrically connected via the bump or the like, and then a thickness of one semiconductor wafer is reduced by grinding the back surface of the semiconductor wafer by means of the grinder. Then, individual laminated semiconductor chips are obtained by applying the dicing to two adhered semiconductor wafers.

In the above related art 1, the protection tape does not have the sufficient rigidity. Therefore, the semiconductor wafer is broken when the thinned semiconductor wafer is carried in a state that the semiconductor wafer is adhered onto the first protection tape, or a bowing of the semiconductor wafer is caused by the residual stress of the passivation film, or the like on the semiconductor wafer. Thus, in some cases it is impossible to carry the semiconductor wafer into the housing cassette.

Also, in the above related art 2, since the rigid glass substrate is employed as the supporting body, the disadvantage caused in the wafer conveyance in the related art 1 can be overcome. But it is extremely difficult to peel off the thinned semiconductor wafer from the glass substrate without breakage in a state that the semiconductor wafer is adhered onto the glass substrate.

In addition, in the above related art 3, since any one of the semiconductor wafers is also used as the supporting substrate, there is no necessity to peel off the semiconductor wafer from the supporting substrate. However, since chips of the overall semiconductor wafer are divided into individual pieces and then packaged, it is possible that the defective chips are mixed with the laminated semiconductor chips and thus it is apprehended that yield of manufacture of the semiconductor device is lowered.

Further, in above Patent Literatures 1 to 3, it is set forth merely that the semiconductor chips are laminated three-dimensionally on the substrate. However, no consideration is given to such a structure that a thickness of the overall semiconductor device should be reduced by laminating the thinned semiconductor chips a thickness of each of which is about 150 μm or less, for example.

SUMMARY OF THE INVENTION

It is an object of the present invention to provide a semiconductor device manufacturing method capable of packaging a thin electronic chip (e.g., 150 μm or less) on a wiring substrate not to cause any disadvantage, and a semiconductor device.

The present invention provides a semiconductor device manufacturing method which comprises the steps of preparing a wiring substrate having a wiring pattern on a surface; bonding a connection terminal of electronic chip, which has a predetermined element and the connection terminal on one surface, to the wiring pattern of the wiring substrate by a flip-chip bonding; forming a first insulating film on the wiring substrate to have a film thickness that covers the electronic chip, or a film thickness that exposes at least another surface of the electronic chip; and reducing a thickness of the electronic chips by grinding another surfaces of the electronic chip and the first insulating.

In the present invention, the non-defective electronic chips that are divided into the individual pieces are bonded to the rigid wiring substrate by the flip-chip mounting, then the electronic chips are covered with the first insulating film and supported, and then the thickness of the electronic chips is reduced by grinding the thirst insulating film and the electronic chips. Otherwise, the electronic chips are not perfectly covered with the first insulating film, but the first insulating film may be formed to have such a film thickness that exposes a part of the other surfaces (back surfaces to be ground) or the side surfaces of the electronic chips. In the step of reducing the thickness of the electronic chips, the electronic chips may be ground by a grinder, or may be ground by the grinder and then may be polished by CMP.

If doing this, unlike the method of reducing the thickness by polishing the semiconductor wafer that is adhered onto the temporary supporting body in the related arts 1 and 2, the disadvantage such that the semiconductor wafer is broken is not caused. Also, in the present invention, the non-defective electronic chips can be selected and mounted onto the wiring substrate. Therefore, unlike the method of bonding two semiconductor wafers and then polishing one semiconductor wafer to reduce the thickness in the related art 3, there is no possibility that the defective electronic chips are mounted on the wiring substrate.

Also, in the present invention, the electronic chip that are divided into the individual pieces are bonded to the wiring substrate by the flip-chip mounting, then ground to reduce the thickness. Therefore, no handling of the thinned semiconductor chips that are difficult to handle is needed.

In addition, the electronic chips are ground in a state that their side surfaces are supported by the insulating film. Therefore, it is not possible that the bonding between the electronic chips and the wiring substrate is damaged in the grinding step, and thus reduction in yield of manufacture of the semiconductor device can be prevented.

In the above semiconductor device manufacturing method, in the step of reducing a thickness of the electronic chips, it is preferable that polished surface of the electronic chip and the upper surface of the insulating film should be planarized at an almost same height.

The grinding surfaces of the electronic chips and the upper surface of the first insulating film can be planarized by grinding the semiconductor chips and the first insulating film to form an almost same surface. Therefore, not only the reliability of the bonding applied when other electronic chips are bonded to the electronic chips by the flip-flop bonding can be improved but also these electronic chips can be bonded without intervention of the bumps. As a result, the thickness of the semiconductor device in which a plurality of semiconductor chips are laminated can be further reduced.

In this manner, thinned electronic chips (e.g., the thickness is 150 µm or less) can be easily mounted on the wiring substrate without generation of any disadvantage.

Also, in one preferred mode of the present invention, after the step of reducing a thickness of the electronic chip, the semiconductor device manufacturing method further comprises the steps of forming a via hole having a depth, which reaches the connection terminal on one surface of the electronic chip from a predetermined portion on another surface of the electronic chip, in the electronic chip; forming a second insulating film on the electronic chip and the first insulating film; forming a wiring recess, which communicates with the via hole, by etching predetermined portion of the second insulating film containing a portion that corresponds to the via hole; and forming a conductive film pattern, which is connected to the connection terminal via the via hole, by filling a conductive film in the via holes and the wiring recesses.

Accordingly, the conductive film patterns connected to the connection terminals on one surface side via the via holes formed in the electronic chips are formed on the other surface (grinding surface) side of the electronic chips. Then, the connection terminals of the overlying electronic chips are bonded onto the conductive film patterns on the electronic chips by the flip-chip bonding, then the electronic chips are ground, and then above steps are repeated, whereby a plurality of electronic chips are laminated and packaged. In this manner, a plurality of electronic chips that are laminated three-dimensionally are connected mutually via the via holes that pass through them.

For this reason, a plurality of semiconductor chips having any size can be arranged and laminated without limitation of their mutual sizes. As a result, selection of the semiconductor chips to be mounted can be expanded, and thus a margin in design can be improved. In addition, a wiring length can be shortened rather than the case where the semiconductor chips are connected by the bonding wires or the like, and the semiconductor device can respond to a higher speed of the signal speed in the high frequency application.

Otherwise, the via holes are not opened in the electronic chips, but the via holes are opened in the insulating film in vicinity of the electronic chips respectively. Thus, the connection terminals on one surface side of the electronic chips may be connected electrically to the conductive film patterns on the other surface side of the electronic chips via the via holes in the insulating film.

DETAILED DESCRIPTION OF THE PREFERRED EMBODIMENTS

Embodiments of the present invention will be explained with reference to the accompanying drawings hereinafter.

First Embodiment

Figure 1A:
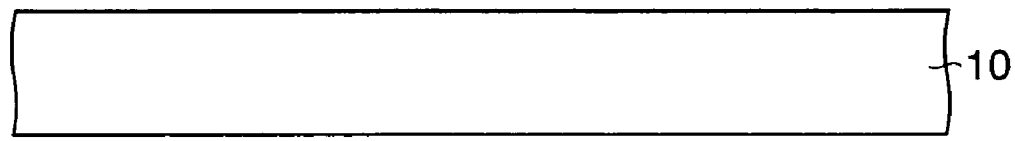
FIG. 1A to FIG. 1O are sectional views showing a semiconductor device manufacturing method according to a first embodiment of the present invention.
Figure 1B:
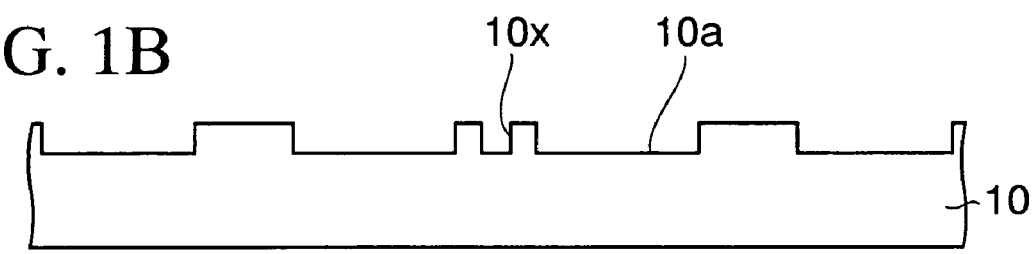
Figure 1C:
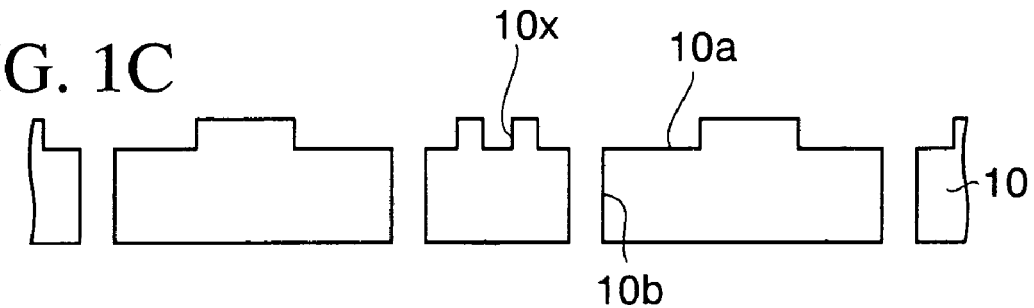
Figure 1D:
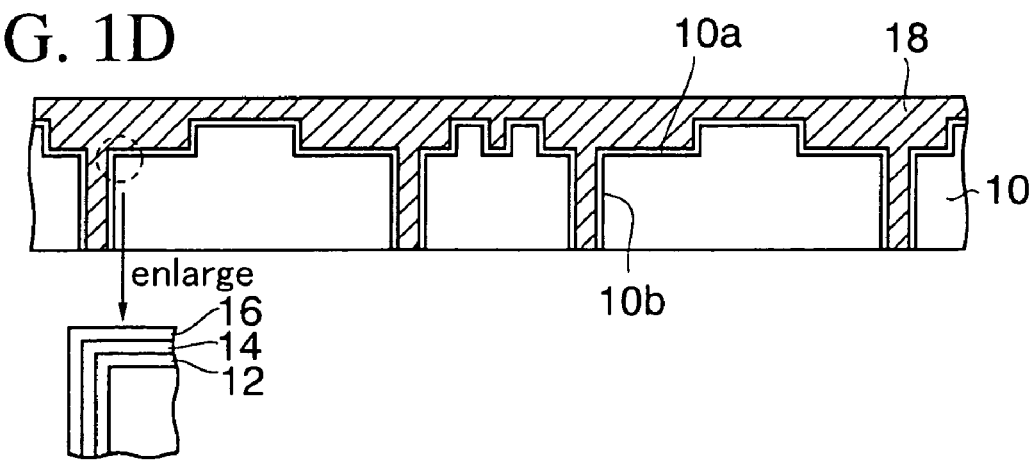
Figure 1E:
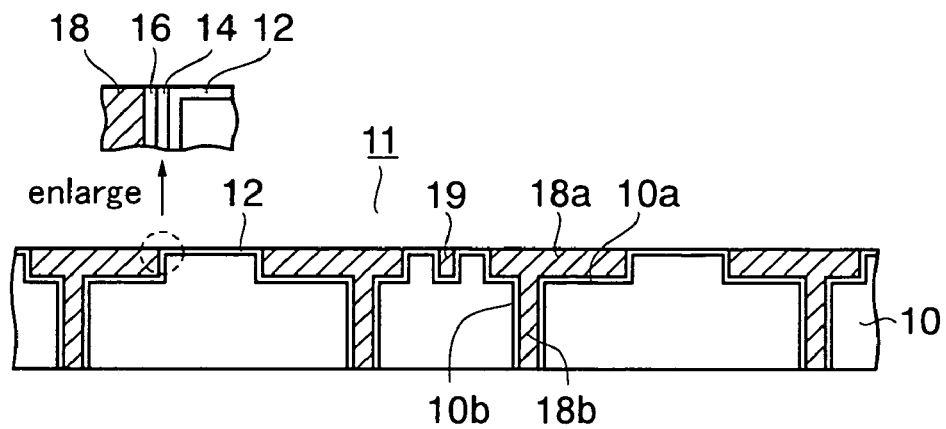
Figure 1F:
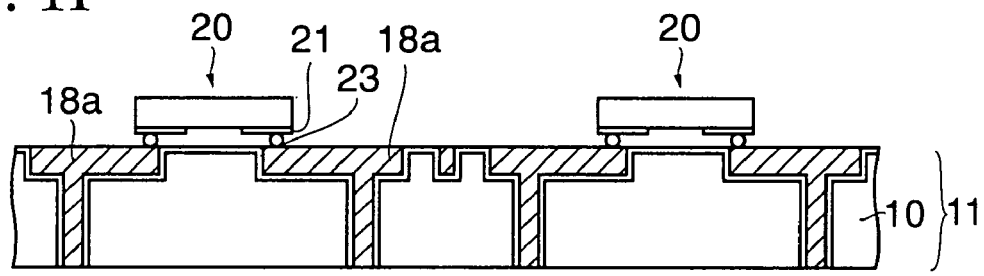
Figure 1G:
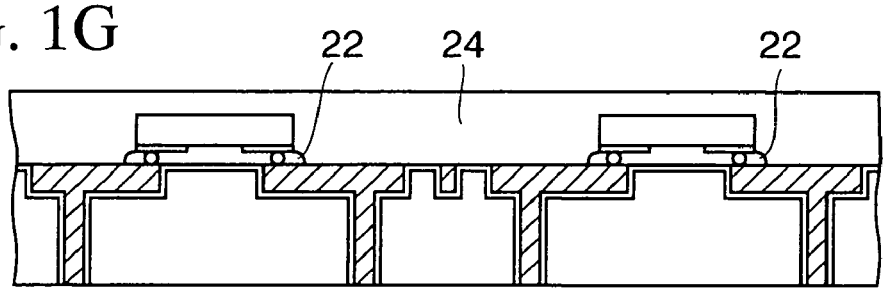
Figure 1H:
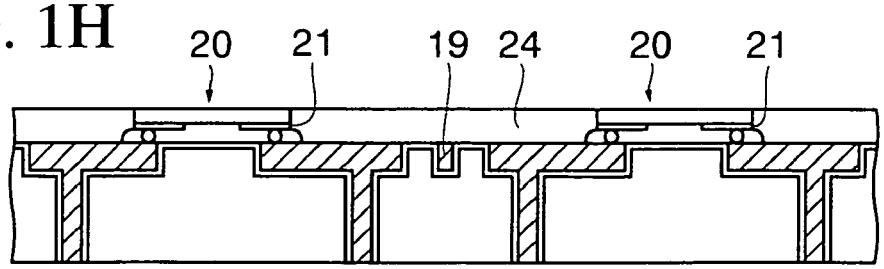
Figure 1I:
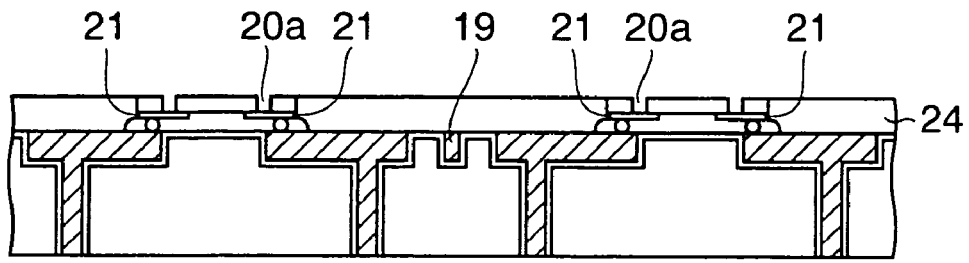
Figure 1J:
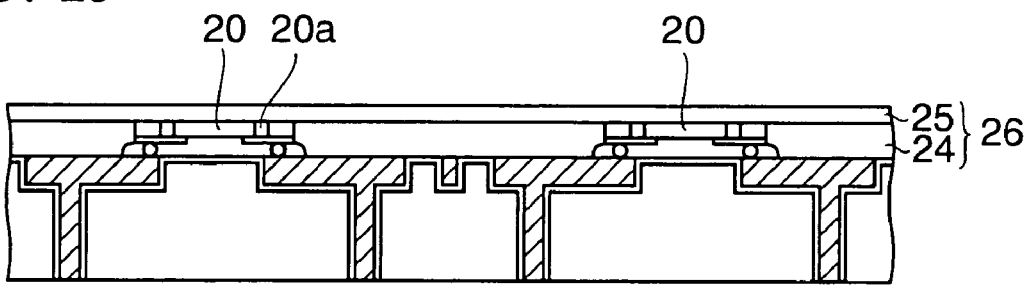
Figure 1K:
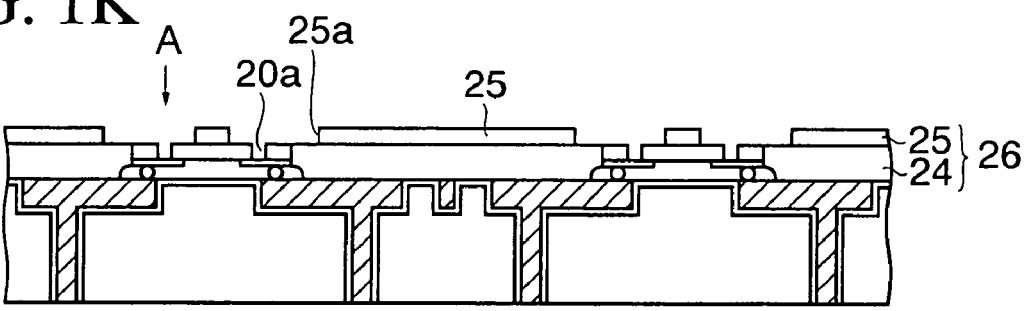
Figure 1L:
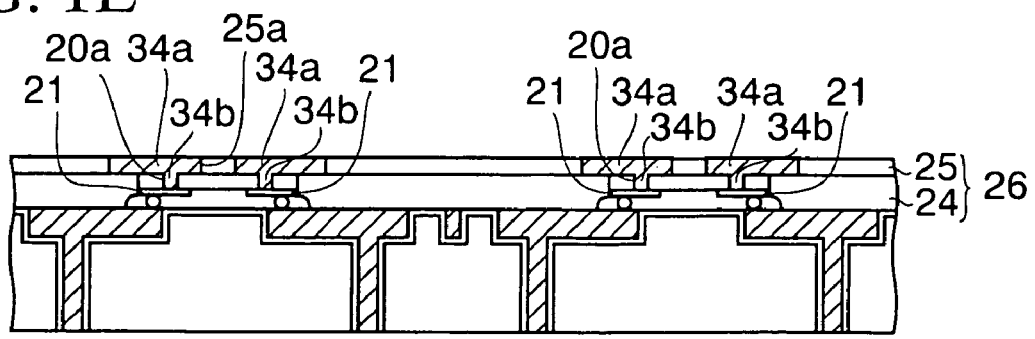
Figure 1M:
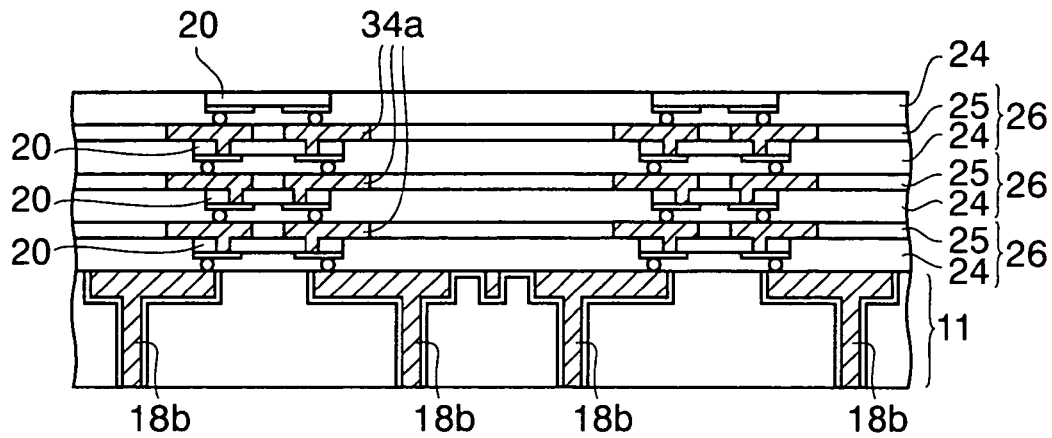
Figure 1N:
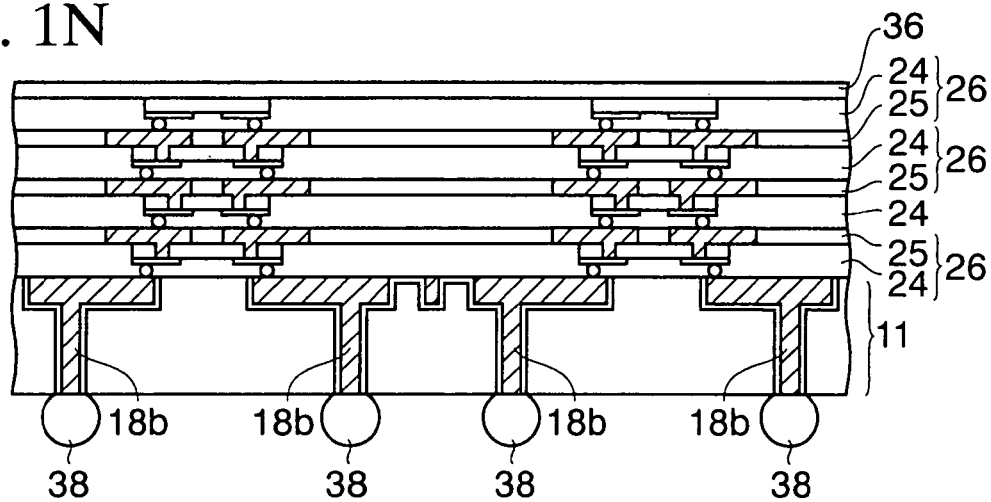
Figure 1O:
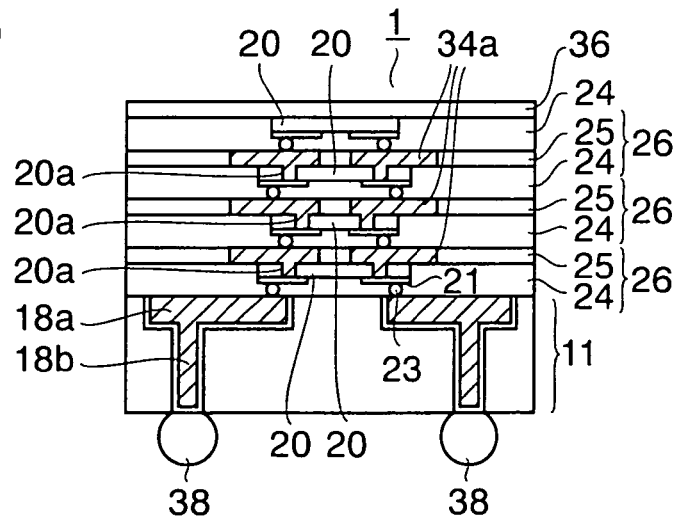

FIG. 1A to FIG. 1O are sectional views showing a semiconductor device manufacturing method according to a first embodiment of the present invention. FIG. 2A to FIG. 2E are sectional views showing details of steps in FIG. 1K and FIG. 1L.

In the semiconductor device manufacturing method according to the first embodiment of the present invention, as shown in FIG. 1A, first a silicon substrate 10 whose thickness is about 400 µm, for example, is prepared. Then, as shown in FIG. 1B, a resist film (not shown) is patterned on the silicon substrate 10 by the photolithography, and then wiring recesses 10a of 3 to 5 µm depth are formed by dry-etching the silicon substrate 10 while using the resist film as a mask. At this time, areas on which a plurality of semiconductor chips are assembled respectively are defined on the silicon substrate 10 and also a recess 10x used to form an alignment mark is formed at the same time. This recess 10x may be formed near a plurality of semiconductor chip assembling areas respectively or may be formed in the peripheral area of the silicon substrate 10.

Then, as shown in FIG. 1C, the resist film (not shown) is patterned by the photolithography to open predetermined portions of bottom surfaces of the wiring recesses 10a. Then, through holes 10b that are passed through from one surface to the other surface are formed by dry-etching the silicon substrate 10 while using the resist film as a mask. In this manner, the wiring recesses 10a and the through holes 10b that are passed through the wiring recesses 10a are formed on the silicon substrate 10.

Then, as shown in FIG. 1D, an inorganic insulating film 12 such as a silicon oxide film, or the like is formed on the silicon substrate 10, on which the wiring recesses 10a and the through holes 10b are formed, by the CVD method. Accordingly, inner surfaces of the wiring recesses 10a and the through holes 10b and an upper surface of the silicon substrate 10 are covered with the inorganic insulating film 12. This inorganic insulating film 12 is formed to insulate a conductor, which is buried in the wiring recesses 10a and the through holes 10b by the post process, from the silicon substrate 10.

Then, as shown similarly in FIG. 1D, a barrier film 14 such as a titanium nitride film (TiN film), a tantalum nitride film (TaN film), or the like is formed on the inorganic insulating film 12 by the sputter method or the CVD method. Then, a seed film 16 made of copper is formed on the barrier film 14 by the sputter method or the like. Then, a Cu film 18 having a film thickness, which fills up the through holes 10b and the wiring recesses 10a, is formed by the electroplating using the barrier film 14 and the seed film 16 as the plating power-supply layer.

Then, as shown in FIG. 1E, the Cu film 18, the seed film 16, and the barrier film 14 are polished by the CMP (Chemical Mechanical Polishing) method until the inorganic insulating film 12 formed on the upper surface of the silicon substrate 10 is exposed. Accordingly, the Cu film 18, the seed film 16, and the barrier film 14 are buried in the through holes 10b and the wiring recesses 10a by the so-called damascene method, so that conductive plugs 18b filled in the through holes 10b and wiring patterns 18a connected to the conductive plugs 18b are formed. At this time, the Cu film 18, the seed film 16, and the barrier film 14 are also buried in the recess 10x for the above alignment mark, and thus an alignment mark 19 is formed at the same time.

In this fashion, the conductive plugs 18b, the wiring patterns 18a, etc. are formed on the silicon substrate 10 as required, whereby a wiring substrate 11 is obtained.

In this case, in the above mode, the conductive plugs 18b and the wiring patterns 18a connected to the conductive plugs 18b are formed by using the damascene method. But the silicon substrate in which the conductive plugs are filled in the through holes may be prepared, and then the wiring patterns may be formed by forming the Cu wirings connected to the conductive plugs by means of the so-called additive process or the subtractive process.

Then, as shown in FIG. 1F, semiconductor chips 20 (electronic chips) each including predetermined elements (not shown) such as transistors, or the like, connection pads 21 (connection terminals), and bumps 23 (connection terminals) connected to the connection pad on one surface are prepared. The semiconductor chip 20 is formed as the chip by applying the dicing to the semiconductor wafer after predetermined elements, etc. are formed on the semiconductor wafer by the ordinary manufacturing method, and its thickness is about 500 μm, for example. Also, the semiconductor chips 20 prepared herein are the non-defective unit that passes predetermined inspections, and the semiconductor chips as the defective unit are excluded from here. In this case, the semiconductor chip 20 is exemplified as an example of the electronic chip. Various electronic chips such as the silicon chip in which the capacitor element, the resistor, and the like are provided on one surface, etc. may be employed.

Then, as shown in FIG. 1F, the bumps 23 of the semiconductor chip 20 which is non-defective unit are bonded to the wiring patterns 18a of the wiring substrate 11 by the flip-chip bonding. At this time, a plurality of semiconductor chips 20 are mounted on a plurality of semiconductor chip mounting areas of the wiring substrate 11 to direct their element non-forming surfaces (referred to as back surfaces hereinafter) the upper side respectively. As the flip-chip bonding process, for example, the solder bump is employed as the bumps 23 of the semiconductor chip 20 and then the bumps 23 of the semiconductor chip 20 and the wiring patterns 18a of the wiring substrate 11 are bonded with the solder. Otherwise, the Au bump is employed as the bumps 23 of the semiconductor chip 20 and then the bumps 23 of the semiconductor chip 20 and the wiring patterns 18a of the wiring substrate 11 may be bonded via the anisotropic conductive material (ACF).

Then, as shown in FIG. 1G, an underfill resin 22 is filled in a clearance between the wiring substrate 11 and the semiconductor chip 20. Otherwise, an insulating resin (NCF or NCP) may be coated previously on predetermined areas including the wiring patterns 18a of the wiring substrate 11 before the semiconductor chip 20 is bonded, and then the flip-chip bonding may be carried out in a state that this resin is interposed.

Then, as shown similarly in FIG. 1G, a first insulating film 24 for covering the semiconductor chips 20 is formed on the semiconductor chips 20 and the wiring substrate 11. Alternatively, as explained in a second embodiment described later, the first insulating film 24 may be formed to expose the back surfaces of the semiconductor chips 20.

In the present embodiment, as an example pf the first insulating film 24, a resin film made of the material that is selected from a group consisting of thermosetting resins including epoxy resin, polyphenylene ether resin, phenol resin, fluororesin, etc. may be employed. First, this resin film is laminated on the semiconductor chips 20 and the wiring substrate 11 at a degree of vacuum of 50 to 1000 Pa and the stage temperature of 50 to 160° C. Then, such resin film is cured by executing the annealing for 10 minute in the oven whose atmosphere is set to 100° C., so that the resin film is formed. It is preferable that, because the resin film as the first insulating film 24 is ground by the post process, the resin film having still the rigidity after the annealing has been executed should be employed.

In this case, in addition to the method of laminating the above resin film, the resin film as the first insulating film 24 may be formed by the spin coating method or the printing method. Also, in addition to the resin film as the first insulating film 24, the silicon oxide film, the silicon nitride film, or the like formed by the CVD method may be employed.

In this way, the semiconductor chips 20 are brought into the condition that they are covered and supported with the first insulating film 24.

Then, as shown in FIG. 1H, the first insulating film 24 is ground by the grinder to expose the back surfaces of the semiconductor chips 20. Then, a thickness of the semiconductor chips 20 is thinned by grinding simultaneously the semiconductor chips 20 and the first insulating film 24. It is preferable that the grinder whose grinding feed speed can be exchanged in multiple stages should be employed as the grinder used to grind.

In this grinding step, first the thickness of semiconductor chips 20 is roughly ground up to about 100 µm by using the grinding wheel (grindstone) which is formed by binding 20 to 30 diamond particles by the vitrified (glass ceramic) or the resin bond (organic resin). The number of revolution of the grindstone spindle is set to about 3000 to 5000 rpm, and the grinding feed speed is reduced to the lower speed as the thickness of the semiconductor chips 20 is reduced smaller (For example, first step (5 to 3 µm/sec), second step (2 to 0.5 µm/sec), third step (1 to 0.3 µm/sec)).

Then, the finishing grinding is executed by using the grinding wheel (grindstone) which is formed by binding 1 to 10 µm diamond particles by the vitrified or the resin bond (organic resin) until the thickness of the semiconductor chips 20 is reduced up to about 25 µm. The number of revolution of the grindstone spindle is set to about 3000 to 5000 rpm, and the grinding feed speed is reduced to the lower speed as the thickness of the semiconductor chips 20 is reduced smaller (For example, first step (1 to 0.5 µm/sec), second step (0.5 to 0.2 µm/sec), third step (0.2 to 0.05 µm/sec)).

In this case, in the grinding of the semiconductor chips 20 and the resin film by the grinder, clogging of the grindstone by the grind scraps is caused and then in some cases burning failure of the semiconductor chips 20 occurs. Therefore, as described above, it is desired that hard and fragile material such as glass ceramic or resin should be selected as the binder of the grindstone.

If the grindstone employing such binder is employed, the work (ground body) becomes difficult to contact the binder. Therefore, such an effect (autogenous effect of the diamond) occurs that the grind scraps are dropped away and the fresh diamond is exposed before the diamond of the grindstone causes the clogging. As a result, the clogging of the grindstone can be prevented. Also, it is preferable that the structure in which a foaming rate of the binder of the grindstone is relatively high should be employed. Accordingly, since it can be expected that the grind scraps escape into air pockets of the grindstone, the clogging of the grindstone can be prevented.

Then, if the grinding damage generated on grinding surfaces of the semiconductor chips 20 and the first insulating film 24 is removed or if the perfect planarization is carried out, the semiconductor chips 20 and the first insulating film 24 are polished further to about 1 to 5 µm by the CMP method. In this case, the grinding surfaces of the semiconductor chips 20 and the first insulating film 24 are planarized as a roughly same surface by the above grinding by means of the grinder. Thus, even if this polishing step is omitted, no trouble is caused.

In order to remove the grinding damage of the grinding surface and execute the perfect planarization in this polishing step, it is preferable that the CMP conditions under which polishing rates of the semiconductor chips 20 and the first insulating film (resin film) 24 are set equal to each other should be employed.

In other words, the polishing is carried out by the CMP method using the polyurethane polishing cloth and the slurry in which colloidal silica, cerium oxide, silicon carbide, silicon nitride, iron oxide, or alumina is dispersed into the alkaline aqueous solution such as ammonia, KOH, or the like. Then, the polishing pad and the wiring substrate 11 are rotated at the number of revolution of 200 to 500 rpm respectively, and then the polishing is carried out in the situation that about ½ to ⅔ surface out of the area of the wiring substrate 11 contacts the polishing pad. Also, the slurry solution is supplied to the polished surface from the inner nozzle, which is arrange on the inside of the polishing pad, and the outer nozzle, which is arrange on the outside of the polishing pad, respectively. According to such configuration, a polishing effect can be improved and also an in-plane uniformity of the polishing can be improved.

In this manner, since the grinding surfaces of the semiconductor chips 20 and the first insulating film 24, which have been subjected to the grinding by the grinder, are polished further by the CMP method, not only the grinding damage of the grinding surfaces can be eliminated but also the flatness of the polished surfaces of the semiconductor chips 20 and the first insulating film 24 can be further improved.

According to the grinding step and the polishing step mentioned above, the thickness of the semiconductor chips 20 is thinned to about 20 µm, for example. It is of course that the final thickness of the semiconductor chips 20 can be adjusted appropriately.

In the present embodiment, the semiconductor chips 20 that are divided into individual pieces are mounted on the rigid wiring substrate 11 by the face down flip-chip bonding, then the semiconductor chips 20 are covered and supported with the first insulating film 24, and then the first insulating film 24 and the semiconductor chips 20 are ground to thin the semiconductor chips 20.

In this manner, in the present embodiment, the semiconductor chips 20 that are divided into individual pieces are mounted on the rigid wiring substrate 11 that is also used as the supporting body, then such semiconductor chips 20 are supported with the first insulating film 24, and then the semiconductor chips 20 are ground to reduce the thickness. Therefore, unlike the related arts 1 and 2 in which the method of grinding the semiconductor wafer being adhered to the temporary supporting body to reduce the thickness is applied, disadvantages such that the semiconductor wafer is broken, etc. are not generated.

Also, in the present embodiment, only the non-defective chips are mounted onto the wiring substrate after it is inspected whether or not the semiconductor chips are good. Therefore, unlike the related art 3 in which the method of grinding one semiconductor wafer to reduce the thickness is applied after two semiconductor wafers are bonded, there is no possibility that the defective chips are mounted on the wiring substrate 11.

Unlike the present embodiment, when the semiconductor chips 20 are ground in a state that the semiconductor chips 20 are adhered only via the underfill resin 22, it is possible that the defective bonding is caused between the semiconductor chips 20 and the wiring substrate 11 due to the damage at the time of grinding. However, in the present embodiment, when the semiconductor chips 20 are to be ground, their side surfaces are supported by the first insulating film 24. Therefore, there is no possibility that the bonding between the semiconductor chips 20 and the wiring substrate 11 is damaged during the grinding step, and thus a reduction in the yield of production of the semiconductor device can be prevented.

Also, the grinding surfaces of the semiconductor chips 20 and the first insulating film 24 can be planarized as the almost same surface. Therefore, as described later, this is convenient for the case where other semiconductor chips are laminated on the semiconductor chips 20 by the flip-chip bonding.

Then, a method of forming wiring patterns, which are connected to the connection pads 21 on the element non-forming surface side, onto the back surface side of the semiconductor chips 20, as shown in FIG. 1H, will be explained hereunder. First, a resist film (not shown) having openings in predetermined portions, which correspond to the connection pads 21 in the peripheral portion on the back surfaces of the thinned semiconductor chips 20, is patterned by the photolithography.

At this time, if a transparent film is used as the first insulating film 24, the alignment can be executed by recognizing the above alignment mark 19 by means of an optical aligning means. Accordingly, the opening portions of the resist film are aligned at predetermined positions with good precision.

In this case, the die-by-die alignment system that executes the alignment by recognizing the alignment marks 19, which are formed in vicinity of a plurality semiconductor chip mounting areas respectively, may be employed. Also, the global alignment system that executes the alignment by estimating exposure positions in design based on the alignment marks 19, which are formed in the peripheral area of the wiring substrate 11, may be employed.

Then, as shown in FIG. 1I, the semiconductor chips 20 are etched by the dry etching using the above resist mask as a mask. At this time, the etching of the semiconductor chips 20 is stopped at the connection pads 21 that are formed on the element formation surface. Thus, via holes 20a a depth of which reaches the connection pad 21 on the element formation surface side from the back surface of the semiconductor chip 20 are formed. In this case, the via holes 20a may be formed in the semiconductor chips 20 by using the laser instead of the dry etching.

If an opaque film is used as the first insulating film 24, the alignment can be executed by recognizing predetermined patterns on the element formation surface side by irradiating the X-rays or the IR (infrared rays) onto the semiconductor chips 20 to transmit there through.

Also, if the thickness of the thinned semiconductor chips 20 is set to about 10 μm or less, the alignment can be executed by recognizing predetermined patterns on the element formation surface side by irradiating the visible rays onto the semiconductor chips 20 to transmit there through. In this case, since the X-rays or the IR (infrared rays) are not used, the necessity of employing the expensive manufacturing system can be eliminated. Thus, reduction in cost of the manufacturing system can be achieved.

Then, as shown in FIG. 1J, a second insulating film 25 is formed on the semiconductor chips 20 and the first insulating film 24. As the second insulating film, a similar film to the resin film exemplified as the first insulating film 24 may be employed. In this case, the via holes 20a formed in the semiconductor chips 20 still remain as a cavity. Thus, an interlayer insulating film 26 consisting of the first insulating film 24 and the second insulating film 25 is formed.

Then, as shown in FIG. 1K, a resist film (not shown) is patterned on the second insulating film 25 by the photolithography to open predetermined areas including the via hole 20a portions of the semiconductor chips 20. Then, the second insulating film 25 is etched by using the resist film as a mask. Thus, the via holes 20a are exposed again and also wiring recesses 25a that are communicated with the via holes 20a are formed.

In this case, as the second insulating film, a resin film may be formed by coating a resin on the semiconductor chips 20 and the first insulating film 24 in place of the adhesion of the insulating film and then applying the annealing to the resin to cure it. In this case, since the resin film is filled in the via holes 20a, such resin film filled in the via holes 20a is removed by the step of forming the wiring recesses 25a.

Figure 2A:
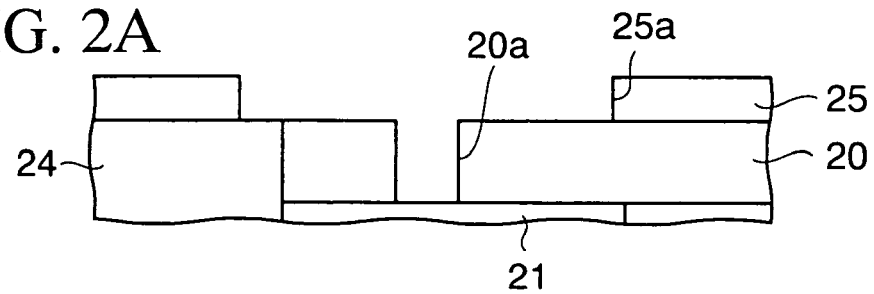
FIG. 2A to FIG. 2E are sectional views showing details of steps in FIG. 1K and FIG. 1L.
Figure 2B:
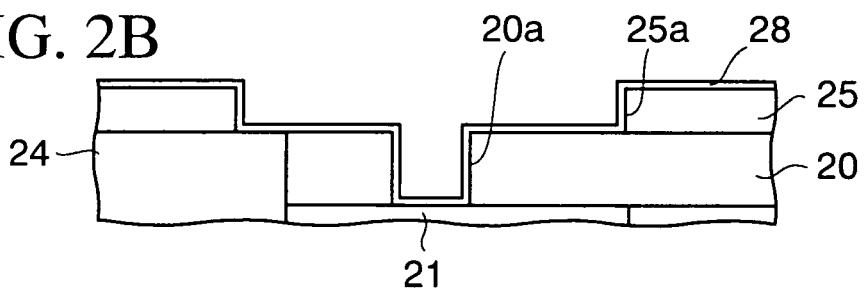

Next, a method of forming wiring patterns by filling a Cu film, or the like in wiring recesses 25a and the wiring recesses 25a in FIG. 1K will be explained with reference to FIG. 2A to FIG. 2E hereunder. FIG. 2A to FIG. 2E are partially enlarged views showing an A portion in FIG. 1K in an enlarged manner. First, as shown in FIG. 2B, an inorganic insulating film 28 such as a silicon oxide film or the like is formed on inner surfaces of the via holes 20a and the wiring recesses 25a and an upper surface of the second insulating film 25 in FIG. 2A by the CVD method. This inorganic insulating film 28 is formed to insulate a conductor, which is filled in the via holes 20a and the wiring recesses 25a, from the semiconductor chips 20.

Figure 2C:
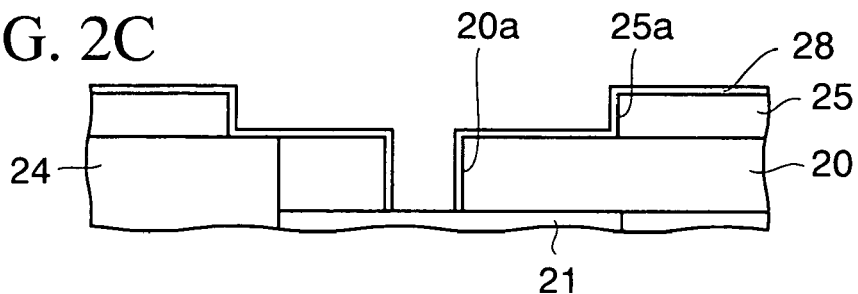

Then, as shown in FIG. 2C, the inorganic insulating film 28 formed on bottom portions of the via holes 20a is removed selectively by the laser, or the like. Thus, the connection pads 21 are exposed from the bottom portions of the via holes 20a.

Figure 2D:
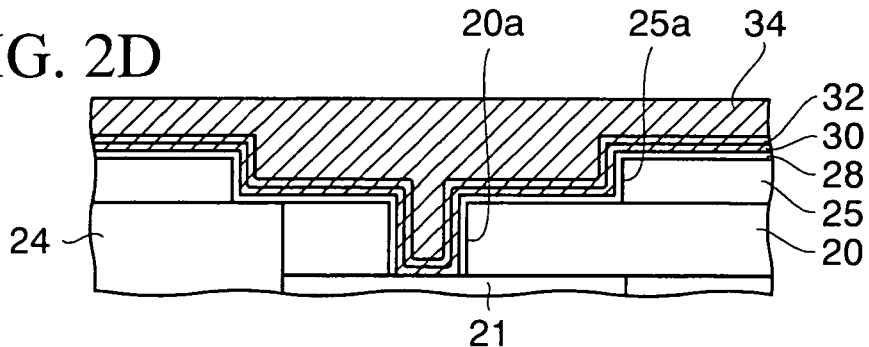
Figure 2E:
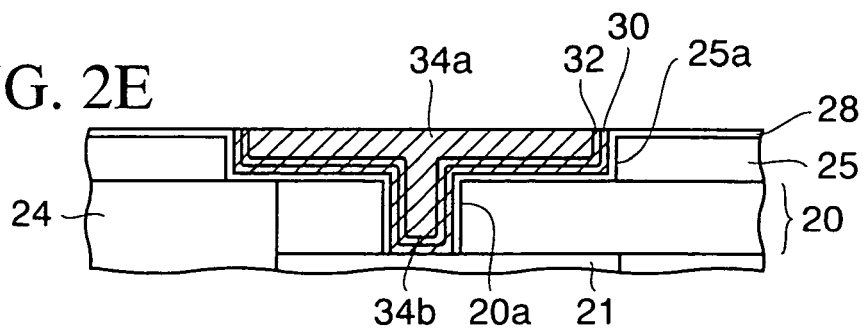

Then, as shown in FIG. 2D, a barrier film 30 made of a TiN film, a TaN film, or the like is formed on the resultant structure in FIG. 2C, and then a seed film 32 made of a Cu film is formed. Then, a Cu film 34 having a film thickness that buries the via holes 20a and the wiring recesses 25a is formed on the seed film 32 by the electroplating using the seed film 32 and the barrier film 30 as a plating power-supply layer.

Then, the Cu film 34, the seed film 32, and the barrier film 30 are polished by the CMP method until an upper surface of the inorganic insulating film 28 is exposed. Thus, the barrier film 30, the seed film 32, and the Cu film 34 are buried in the via holes 20a and the wiring recesses 25a, so that a conductive plug 34b and a wiring pattern 34a (conductive film pattern) connected to the conductive plug 34b are formed.

In this case, the conductive plug 34b and the wiring pattern 34a may be formed by coating a conductive paste in the via holes 20a and the wiring recesses 25a to bury them, and then polishing the conductive paste by the CMP method.

In this manner, as shown in FIG. 2D, the connection pad 21 on the element formation surface of the semiconductor chip 20 is connected electrically to the wiring pattern 34a on the back surface side via the conductive plug 34b filled in the via hole 20a.

Then, a series of steps from the step of bonding the semiconductor chips 20 by the flip-chip bonding (FIG. 1F) to the step of forming the wiring patterns 34a on the back surface side of the semiconductor chips 20 (FIG. 1L) are repeated n times (n is an integer of 1 or more). Then, the uppermost semiconductor chips 20 are mounted by the flip-chip mounting, and then the first insulating film 24 is formed and then polished. As a result, a plurality of thinned semiconductor chips 20 are laminated three-dimensionally on the wiring substrate 11 and packaged. FIG. 1M shows the mode that four semiconductor chips 20 are laminated and packaged.

Then, as shown in FIG. 1N, a passivation film 36 made of the silicon nitride film, the polyimide film, or the like is formed on the uppermost semiconductor chips 20 and the first insulating film 24. Since the above interlayer insulating film 26 consisting of the first insulating film 24 and the second insulating film 25 is formed of the resin films, for example, such interlayer insulating film 26 is formed in the situation that the residual stress of the film is relatively large. In addition, since the interlayer insulating film 26 made of the resin film are laminated and formed, it is supposed that a bowing is generated in the resultant structure in FIG. 1M due to the residual stress of these films.

However, in the present embodiment, the bowing can be corrected by forming the passivation film 36 when the bowing is generated in the resultant structure in FIG. 1M. For example, if the residual stress of the interlayer insulating film 26 is the tensile stress, the passivation film 36 is formed to apply the compressive stress that cancels the tensile stress of the interlayer insulating film 26.

Then, as shown similarly in FIG. 1N, bumps 38 are formed by mounting solder balls on the conductive plugs 18b that are exposed from the surface of the wiring substrate 11, on which the semiconductor chips 20 are not mounted. In this case, the thickness of the wiring substrate 11 may be thinned up to about 50 to 100 µm by polishing the surface of the wiring substrate 11, on which the semiconductor chips 20 are not mounted, prior to the formation of the bumps 38.

As a result, the structural body (stacked CSP structure) in which a plurality of semiconductor chips 20 are laminated and packaged is arranged successively on plural areas of the wiring substrate 11. Then, as shown in FIG. 1O, a semiconductor device 1 having the stacked CSP structure according to the present embodiment is completed by dividing a plurality of structural bodies in FIG. 1N individually. In this case, the bumps 38 may be formed after a plurality of structural bodies in FIG. 1M are divided. Also, a plurality of structural bodies may be divided to include two stacked CSP structures or more.

In the semiconductor device 1 of the present embodiment, the semiconductor chips 20 are mounted on the wiring substrate 11 by the flip-chip mounting, and also the back surfaces of the semiconductor chips 20 are ground to reduce the thickness in a state that the semiconductor chips 20 are held by the first insulating film 24. The wiring patterns 34a are formed on the back surface side of the semiconductor chips 20, and also the wiring patterns 34a are connected electrically to the connection pads 21 on the element formation surface via the via holes 20a that pass through the semiconductor chips 20. A plurality of semiconductor chips 20 having such structure are laminated three-dimensionally, connected mutually and packaged in the state that the semiconductor chips 20 are buried in the interlayer insulating film 26.

Here, unlike the present embodiment, for example, the packaging structure in which parent chips and child chips are laminated on the wiring substrate in a face-up fashion and packaged and also the connection pads of these chips are connected to the wiring substrate by the wire bonding method is supposed. In this case, since the child chips are mounted in a state that wire bonding areas of the parent chips are assured, a size of the child chip is restricted.

However, in the semiconductor device 1 of the present embodiment, a plurality of semiconductor chips 20 are bonded mutually via the via holes 20a formed in the semiconductor chips 20 and connected electrically to the wiring substrate 11. Thus, a plurality of semiconductor chips 20 having any size can be arranged and laminated without limitation of their mutual sizes. As a result, selection of the semiconductor chips to be mounted can be expanded, and thus a margin in design can be improved.

Also, since the wiring patterns 34a are formed on the back surfaces of the semiconductor chips 20 via the thin inorganic insulating film 28, the thickness of the semiconductor device 1 in which a plurality of semiconductor chips 20 are packaged can be reduced.

In addition, the upper and lower semiconductor chips 20 are connected mutually by the wirings provided in the vertical direction via the via holes 20a that pass through the semiconductor chips 20. Therefore, a wiring length can be shortened rather than the case where the semiconductor chips are connected by the bonding wires or the case where the wirings containing the wiring routing in the lateral direction are implemented. As a result, the semiconductor device can respond to a higher speed of the signal speed in the high frequency application.

Also, if the semiconductor chips 20, e.g., a CPU and a memory are packaged in close vicinity, the wiring length can be shortened. Therefore, this is convenient for a viewpoint that the performance of the semiconductor device 1 can be improved.

In addition, the semiconductor chips 20 that are divided into the individual pieces are polished to reduce the thickness in the state that they are held by the first insulating film 24 after they are mounted on the wiring substrate 11 by the flip-chip mounting. Therefore, no handling of the thinned semiconductor chips 20 that are difficult to handle is needed. If doing this, the thickness of the semiconductor chips 20 can be reduced up to about 10 µm not to generate any disadvantage.

Also, the first insulating film 24 is also ground at the same time when the semiconductor chips 20 are ground. Therefore, both grinding surfaces of semiconductor chips 20 whose thickness is thinned and the first insulating film 24 can be planarized to have an almost same height.

In the present embodiment, the mode that the bumps 23 of the semiconductor chips 20 are bonded and mounted is exemplified. Since the mounting surfaces are planarized as described above, the connection pads 21 of the overlying semiconductor chips 20 can be directly bonded to the wiring patterns 34a on the back surface side of the underlying semiconductor chips 20 without intervention of the bumps 23 to mount. In addition, since the wiring patterns 18a of the wiring substrate 11 are formed by the damascene method, the mounting surface of the wiring substrate 11 are also planarized. Therefore, the bumps 23 can be omitted similarly from the lowermost semiconductor chips 20 that are bonded to the wiring substrate 11.

In this fashion, since the bumps 23 of a plurality of semiconductor chips 20 to be mounted can be omitted, the thickness of the semiconductor device 1 can be further reduced.

In this case, in the first embodiment, the mode that a plurality of laminated semiconductor chips 20 are connected mutually via the via holes 20a formed in these semiconductor chips 20 is exemplified. Like a second embodiment described later, a plurality of semiconductor chips 20 may be connected mutually via the via holes that are formed in the first insulating film 24 in the neighborhood of the semiconductor chips.

Also, the semiconductor device according to the first embodiment may be manufactured by using the glass substrate in place of the silicon substrate 10. In this case, it is not needed to form the inorganic insulating film 12.

Second Embodiment

Figure 3A:
FIG. 3A to FIG. 3O are sectional views showing a semiconductor device manufacturing method according to a second embodiment of the present invention.
Figure 3B:
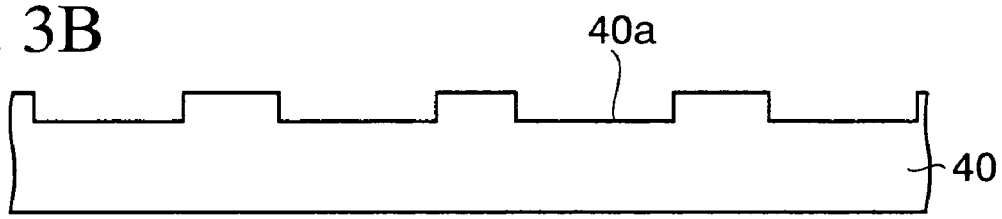
Figure 3C:
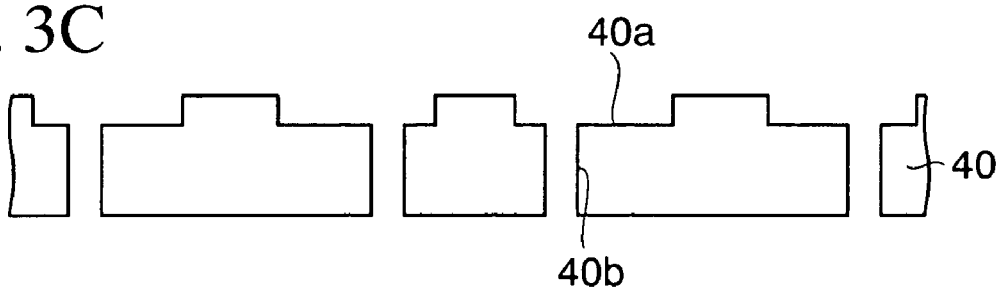
Figure 3D:
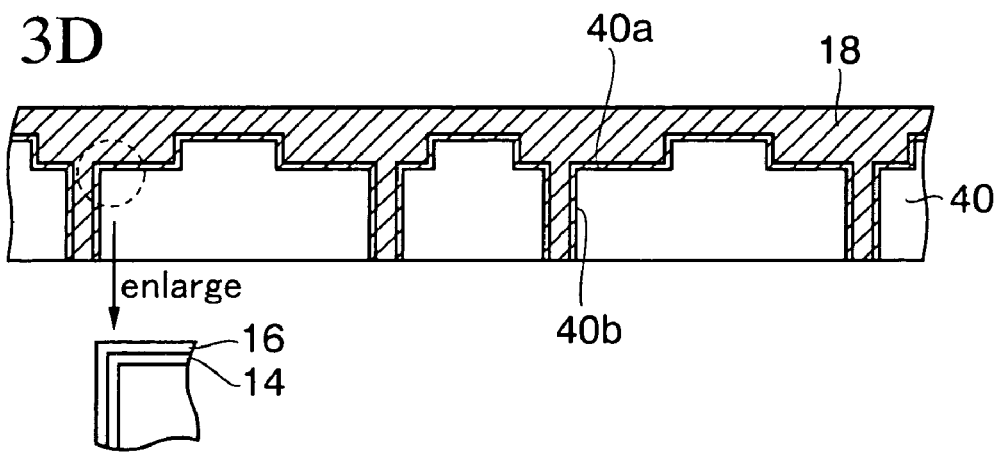
Figure 3E:
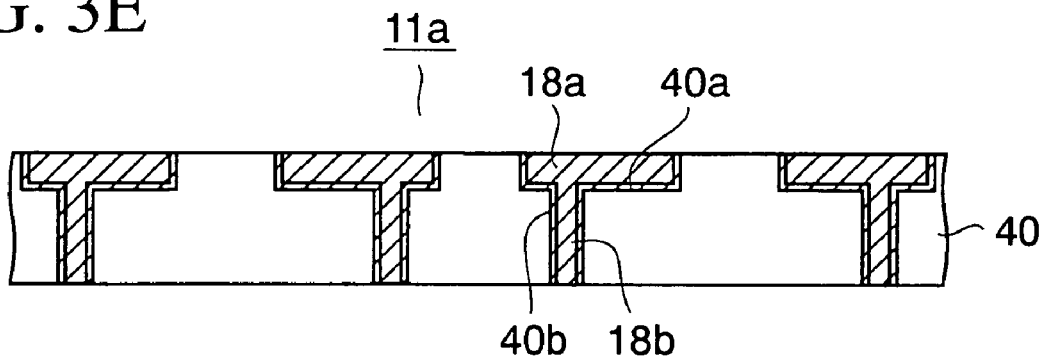
Figure 3F:
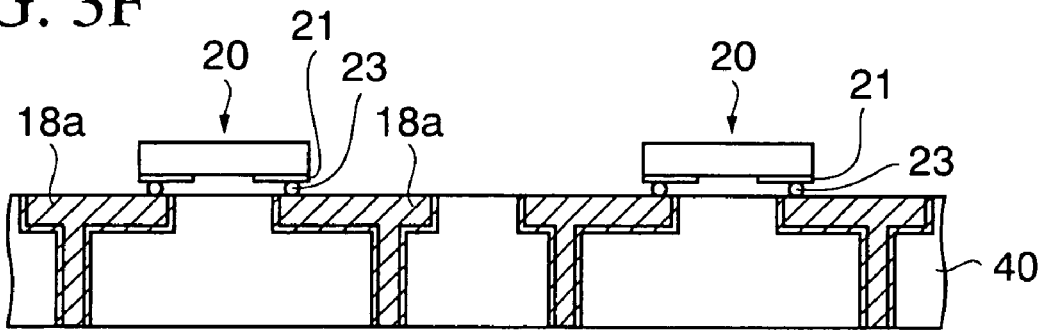
Figure 3G:
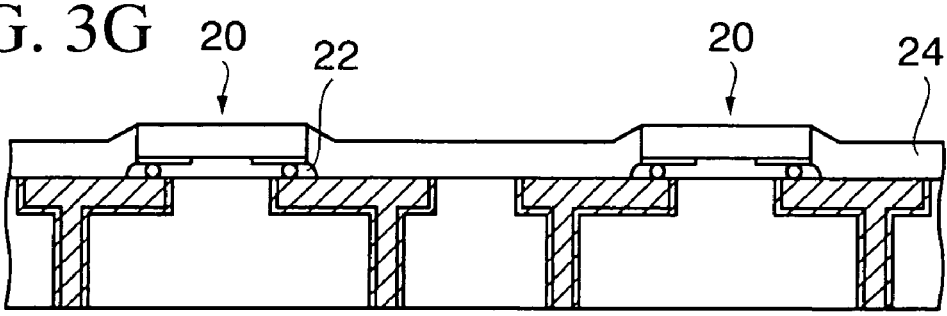
Figure 3H:
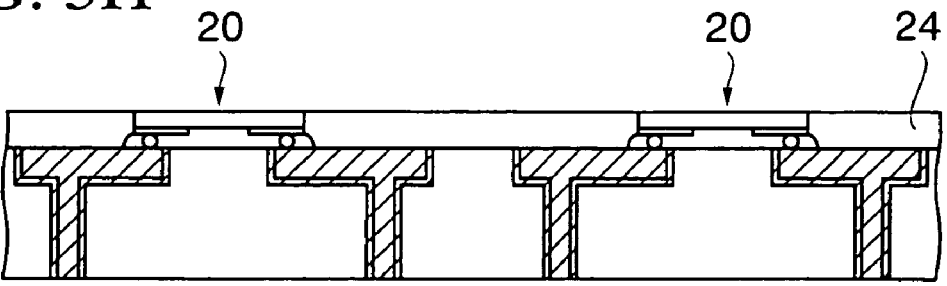
Figure 3I:
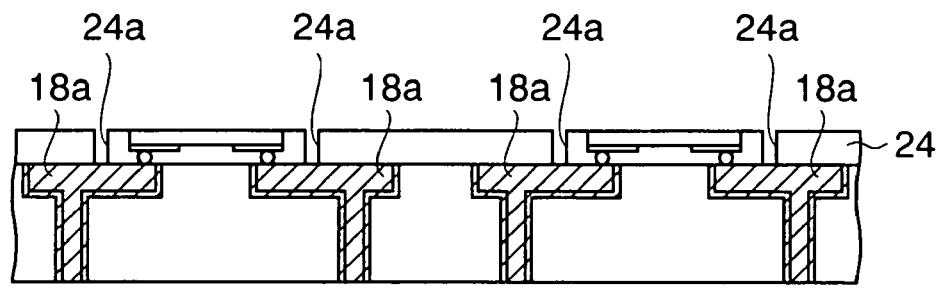
Figure 3J:
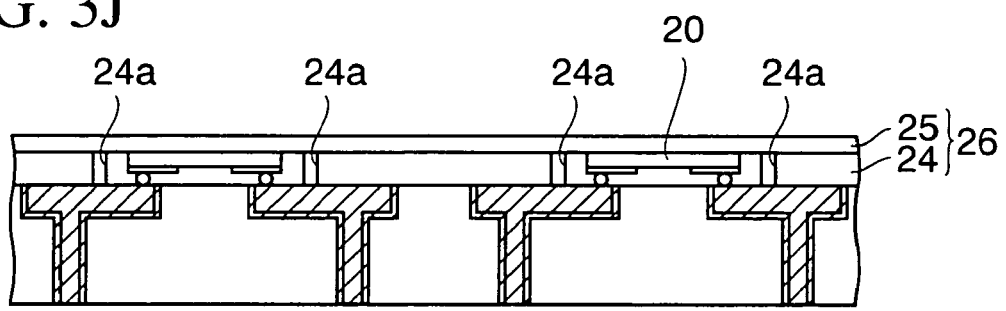
Figure 3K:
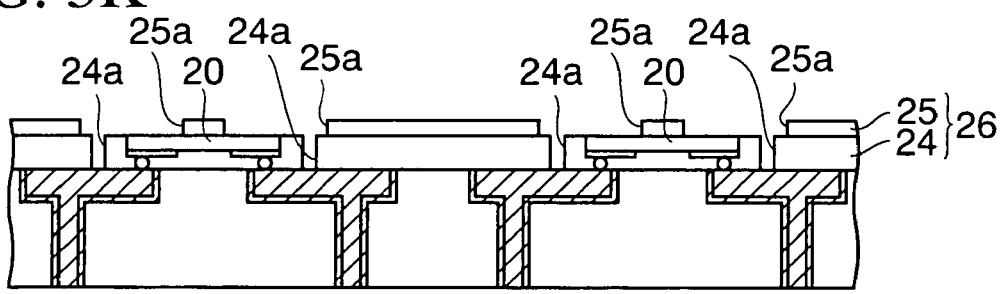
Figure 3L:
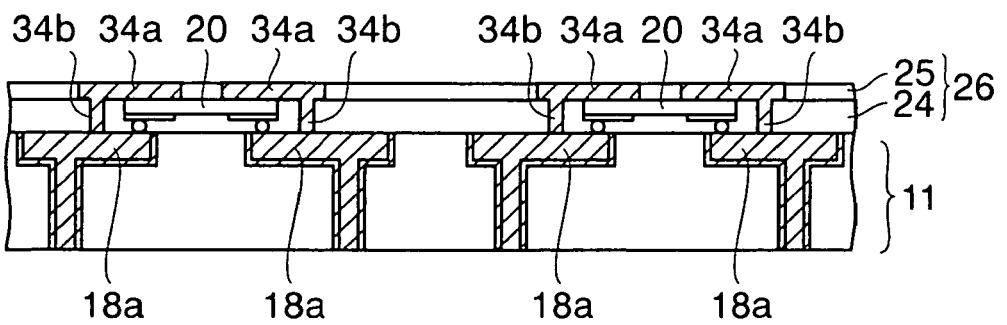
Figure 3M:
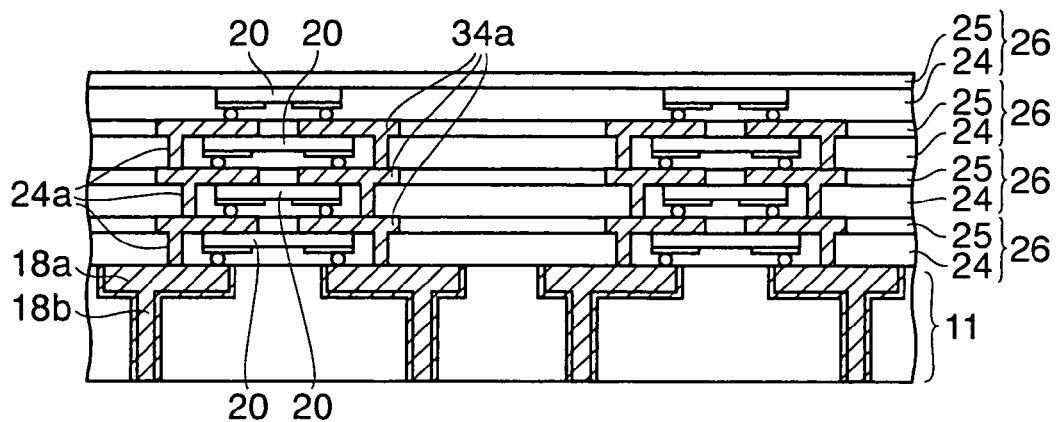
Figure 3N:
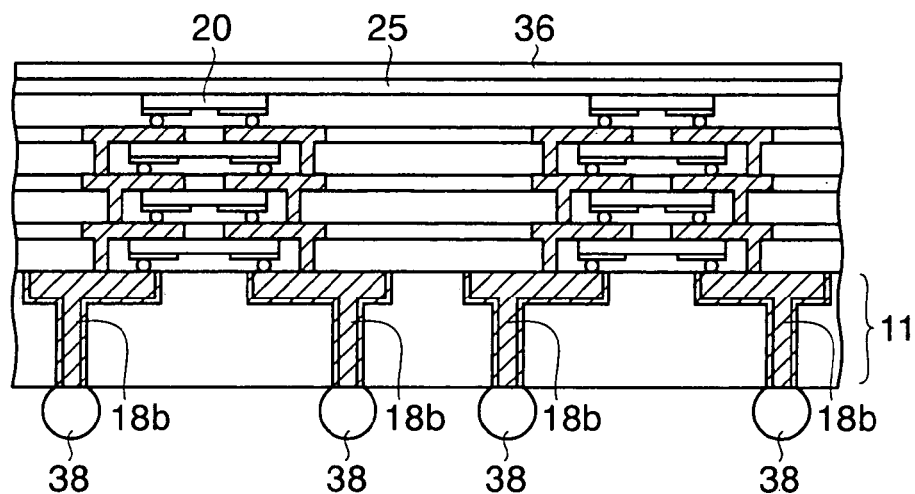
Figure 3O:
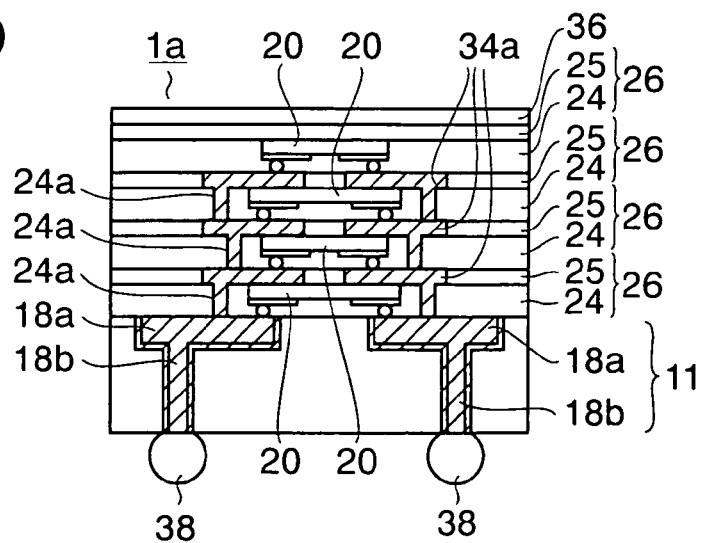

FIG. 3A to FIG. 3O are sectional views showing a semiconductor device manufacturing method according to a second embodiment of the present invention in order of steps. Different points of the second embodiment from the first embodiment reside in that the wiring substrate is formed of an insulating substrate and that a plurality of laminated semiconductor chips are connected mutually via the via holes that are formed in the insulating film in the neighborhood of the semiconductor chips. In this case, detailed explanations of the steps that are similar to the first embodiment will be omitted herein.

In the semiconductor device manufacturing method according to the second embodiment of the present invention, as shown in FIG. 3A, first an insulating substrate 40 is prepared. As the insulating substrate 40, a substrate selected from a group consisting of a resin substrate made of FR4, BT or the like, a glass substrate, a ceramic substrate, a sapphire substrate, etc. may be employed.

Then, as shown in FIG. 3B and FIG. 3C, wiring recesses 40a are formed on the insulating substrate 40, and then through holes 40b that pass from predetermined areas of bottom surfaces of the wiring recesses 40a to the back surface are formed. Then, as shown in FIG. 3D, the barrier film 14 and the seed film 16 are formed sequentially on the insulating substrate 40, in which the wiring recesses 40a and the through holes 40b are formed, by the same method as the first embodiment. Then, the Cu film 18 is formed by the electroplating to have a film thickness that can bury the wiring recesses 40a and the through holes 40b. In this case, since the insulating substrate 40 is employed in the second embodiment, it is not needed to form the inorganic insulating film before the barrier film 14 is formed.

Then, as shown in FIG. 3E, according to the similar method to the first embodiment, the Cu film 18, the seed film 16, and the barrier film 14 are polished by the CMP method until an upper surface of the insulating substrate 40 is exposed. Accordingly, the conductive plugs 18b, which are filled in the through holes 40b, and the wiring pattern 18a, which are connected to the conductive plugs 18b, are formed, and thus a wiring substrate 11a is obtained.

In this case, the mode that the conductive plugs 18b filled in the through holes 40b and the wiring pattern 18a connected to the conductive plugs 18b are formed by using the damascene method is exemplified. But a base substrate for the built-up wiring (in which the through-hole Cu plating layer is formed and the holes are filled with the resin) may be prepared, and then Cu wirings connected to the through-hole Cu plating layer may be formed by the so-called additive method or the subtractive method to form wiring patterns.

Then, as shown in FIG. 3F, according to the similar method to the first embodiment, a plurality of non-defective semiconductor chips 20 are bonded to the wiring patterns 18a of the wiring substrate 11a by the flip-chip bonding. Then, as shown in FIG. 3G, the first insulating film 24 is formed on the wiring substrate 11a to have a film thickness that exposes at least the back surfaces of the semiconductor chips 20. As an example of the method of forming the first insulating film 24, first a coating liquid such as an epoxy resin or a polyimide resin is dropped on a center portion of the wiring substrate 11a by a predetermined amount while rotating the wiring substrate 11a at a low speed of about 300 rpm. Thus, the coating liquid is spread over an overall surface of the wiring substrate 11a. Then, the coating film formed to spread over the back surface of the wiring substrate 11a is excluded by rotating the wiring substrate 11a at a high speed of about 3000 rpm. In this matter, the coating film having a thickness that exposes the back surfaces of the semiconductor chips 20 is formed on the mounting surface of the wiring substrate 11a.

Then, the coating film is cured by annealing in an oven whose atmosphere is set to 150° C., so that a resin film is formed. Thus, the first insulating film 24 made of the resin film in a so-called fillet form is formed between a plurality of semiconductor chips 20 in the state that the back surfaces of the semiconductor chips 20 are exposed. In the second embodiment, the semiconductor chips 20 are supported by the first insulating film 24 in this manner.

Then, as shown in FIG. 3H, according to the similar method to the first embodiment, the thickness of the semiconductor chips 20 is thinned to about 20 μm by grinding the semiconductor chips 20 and the first insulating film 24 by virtue of the grinder. In this case, like the first embodiment, the semiconductor chips 20 may be polished by the CMP method after such semiconductor chips 20 are ground by the grinder.

Then, as shown in FIG. 3I, via holes 24a are formed by opening the portions, which correspond to predetermined portions of the wiring patterns 18a on the wiring substrate 11 in the first insulating film 24 in the neighborhood of the semiconductor chips 20, by the laser. Otherwise, photosensitive polyimide resin may be employed as the first insulating film 24 and then the via holes 24a may be formed by exposing/developing the resin.

Then, as shown in FIG. 3J, according to the similar method to the first embodiment, the second insulating film 25 is formed on the first insulating film 24 and the semiconductor chips 20. Thus, the interlayer insulating film 26 consisting of the first insulating film 24 and the second insulating film 25 is formed.

Then, as shown in FIG. 3K, the wiring recesses 25a are formed by etching predetermined areas including the portions that correspond to the via holes 24a in the second insulating film 25. Thus, the via holes 24a and the wiring recesses 25a, which are communicated with the via holes 24a, are formed. In this case, in the second embodiment, as the second insulating film 25, a resin layer which is formed by a spin coating method or a printing method may be employed instead of the resin film.

Then, as shown in FIG. 3L, according to the similar method to the first embodiment, the barrier film, the seed film, and the Cu film (not shown) are formed sequentially from the bottom on the resultant structure in FIG. 3K. Then, the conductive plugs 34b and the wiring patterns 34a connected to the conductive plugs 34b are formed by polishing these layers. As a result, the wiring patterns 18a of the wiring substrate 11 are connected electrically to the wiring patterns 34a formed on the back surface side of the semiconductor chips 20 via the conductive plugs 34b.

Then, as shown in FIG. 3M, a series of steps from the step of bonding the semiconductor chips 20 to the wiring substrate 11 by the flip-chip bonding (FIG. 3F) to the step of forming the wiring patterns 34a on the back surface side of the semiconductor chips 20 (FIG. 3L) are repeated n times (n is an integer of 1 or more). Then, the uppermost semiconductor chips 20 are mounted by the flip-chip mounting, and then the first insulating film 24 is formed and then polished.

As a result, a plurality of thinned semiconductor chips 20 are laminated three-dimensionally on the wiring substrate 11 and packaged. Then, the second insulating film 25 for covering the uppermost semiconductor chips 20 is formed. In this case, in FIG. 3M, the mode that four semiconductor chips 20 are laminated and packaged is shown.

Then, as shown in FIG. 3N, like the first embodiment, the passivation film 36 is formed on the second insulating film 25 to serve also as the purpose of correcting the bowing of the resultant structure in FIG. 3M. Then, the bumps 38 connected to the conductive plugs 18b, which are exposed from the surface areas of the wiring substrate 11 on which the semiconductor chips 20 are not mounted, are formed.

Then, like the first embodiment, a semiconductor device 1a having the stacked CSP structure is completed by dividing a plurality of structural bodies in FIG. 3N individually.

In the semiconductor device 1a of the second embodiment, unlike the first embodiment, the via holes 20a that pass through the semiconductor chips are not formed in a plurality of semiconductor chips 20, but the via holes 24a are formed in the first insulating film 24 in vicinity of a plurality of semiconductor chips 20 respectively.

The lowermost semiconductor chips 20 are mounted on the wiring patterns 18a of the wiring substrate 11 by the flip-chip mounting, and the back surfaces of the semiconductor chips 20 are ground and thinned in the state that such semiconductor chips 20 are held by the first insulating film 24. The wiring patterns 34a are formed on the back surfaces of the semiconductor chips 20 to contact them. The wiring patterns 34a are connected electrically to the connection pads 21 on the element formation surface side via the via holes 24a formed in the first insulating film 24. A plurality of semiconductor chips 20 having such structure are laminated three-dimensionally and connected mutually in the state that the semiconductor chips 20 are buried in the interlayer insulating film 26.

The semiconductor device 1a of the second embodiment can achieve the same advantages as the first embodiment. In addition, in the second embodiment, the wiring patterns are formed in the state that they come into contact with the back surfaces of the semiconductor chips 20. Therefore, the thickness of the semiconductor device 1 in which a plurality of semiconductor chips 20 are packaged can be further thinned.

Also, in the second embodiment, the via holes 20a are not formed in the semiconductor chips 20, but the via holes 24a are formed in the first insulating film 24. Therefore, the via holes 24a can be formed easily by employing the laser equipment and the exposure equipment, which are normally used, without the introduction of the special aligning means. As a result, a production cost of the semiconductor device can be reduced lower than the first embodiment.

In this case, in the second embodiment, like the first embodiment, various modifications and variations can be applied. For example, the wiring substrate 11 may be formed by using the insulating substrate 40, and also a plurality of semiconductor chips may be connected mutually not by forming the via holes 24a in the first insulating film 24 but by forming the via holes 20a in the semiconductor chips 20, like the first embodiment.

Third Embodiment

Figure 4A:
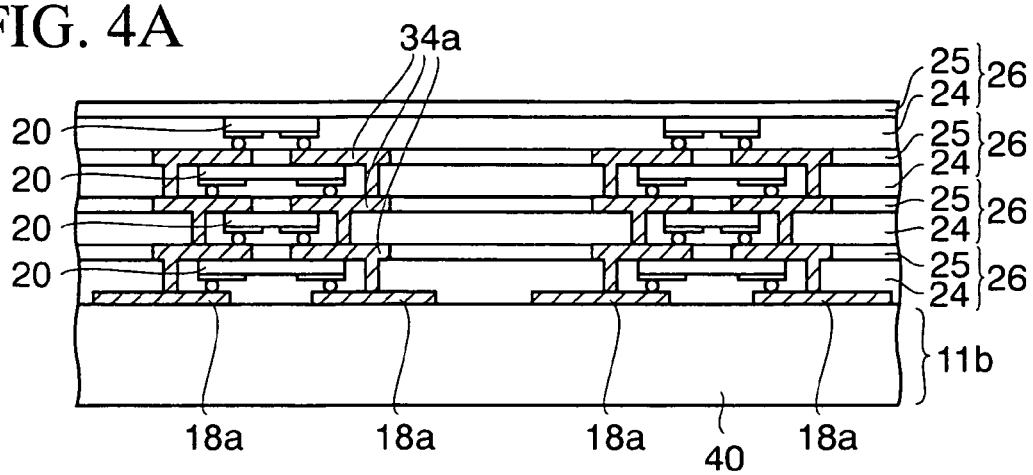
FIG. 4A to FIG. 4C are sectional views showing a semiconductor device manufacturing method according to a third embodiment of the present invention.
Figure 4B:
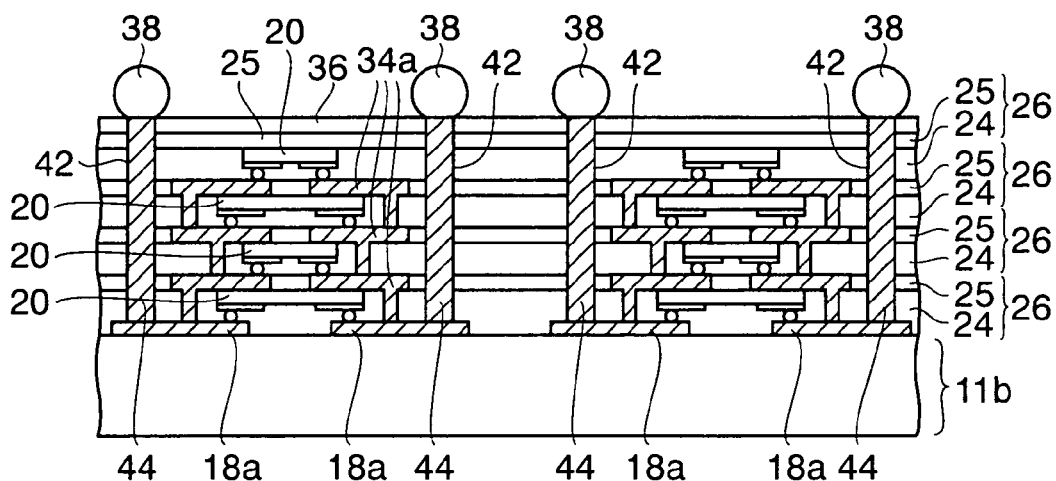
Figure 4C:
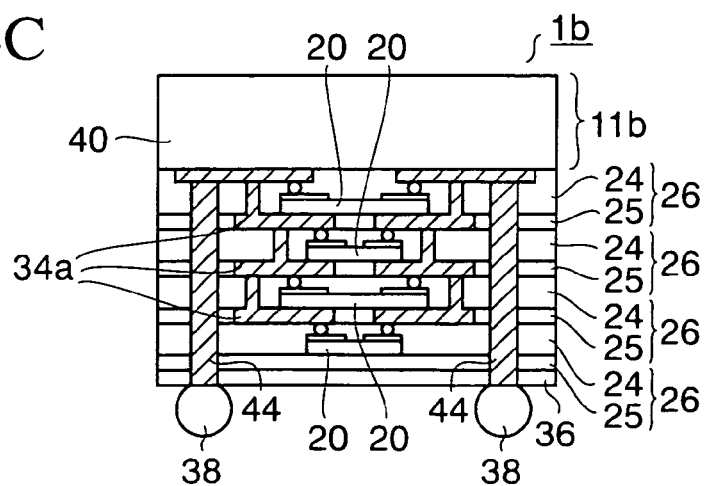

FIG. 4A to FIG. 4C are sectional views showing a semiconductor device manufacturing method according to a third embodiment of the present invention. In the above second embodiment, if the resin substrate made of FR4, BT, or the like is employed particularly as the insulating substrate, the resin substrate is inferior in the fine patterning characteristic to the silicon substrate. Therefore, such a situation is supposed that an increase in the production cost is brought about in the step of forming the fine wiring recesses and the through via holes by the damascene method. The third embodiment can overcome such disadvantage. In this case, detailed explanation of the same steps as the first and second embodiments will be omitted herein.

In the semiconductor device manufacturing method according to the third embodiment of the present invention, as shown in FIG. 4A, first a wiring substrate 11b in which the predetermined wiring patterns 18a made of the Cu wiring are formed on one surface of the insulating substrate 40 is formed. As the method of forming the wiring patterns 18a, a photosensitive insulating resin film pattern having opening portions, at which the wiring patterns 18a of the insulating substrate 40 are formed, is formed, and then the Cu film is formed selectively in the opening portions by the electroless plating (additive method). Otherwise, the Cu film is formed on one surface of the insulating substrate 40 by the electroless plating and electroplating, and then the Cu film is patterned by the photolithography and the etching (subtractive method).

In this manner, the wiring patterns 18a are formed on the insulating substrate 40 by the normal additive method or subtractive method. Therefore, the step of forming the wiring recesses and the through via holes by finely patterning the insulating substrate 40 is not needed, and thus an increase in the production cost of the wiring substrate can be suppressed.

As shown similarly in FIG. 4A, according to the similar method to the second embodiment, a plurality of semiconductor chips 20 connected to the wiring patterns 18a of the wiring substrate 11b are laminated and packaged.

Then, as shown in FIG. 4B, the passivation film 36 is formed on the second insulating film 25 on the uppermost semiconductor chips 20. Then, the interlayer insulating film 26 and the passivation film 36 laminated on the outside portion of the wiring patterns 18a of the wiring substrate 11b are etched by the drill, the laser, or the like. Thus, via holes 42 for exposing a part of the wiring patterns 18a of the wiring substrate 11b are formed.

Then, conductive plugs 44 connected to the wiring patterns 18a of the wiring substrate 11b are formed by filling the conductive paste in the via holes 42, or the like. Then, the bumps 38 connected to the conductive plugs 44 are formed.

Then, like the first embodiment, a semiconductor device 1b having the stacked CSP structure is completed by dividing a plurality of structural bodies in FIG. 4B individually.

In the semiconductor device 1b of the third embodiment, a plurality of semiconductor chips 20 are connected mutually and laminated on the wiring substrate 11b to have the same structure as the second embodiment. The wiring patterns 18a of the wiring substrate 11b are connected to the bumps 38 formed on the surface on passivation film 36 side via the via holes 42 formed in the laminated interlayer insulating films 26.

The third embodiment can achieve the same advantages as the second embodiment. In addition, since the fine patterning is not applied to the insulating substrate 40, the semiconductor device according to the third embodiment of the present invention can be manufactured easily without the increase in the production cost even when the resin substrate that is inferior in the fine patterning characteristic to the silicon substrate is employed.

Fourth Embodiment

Figure 5:
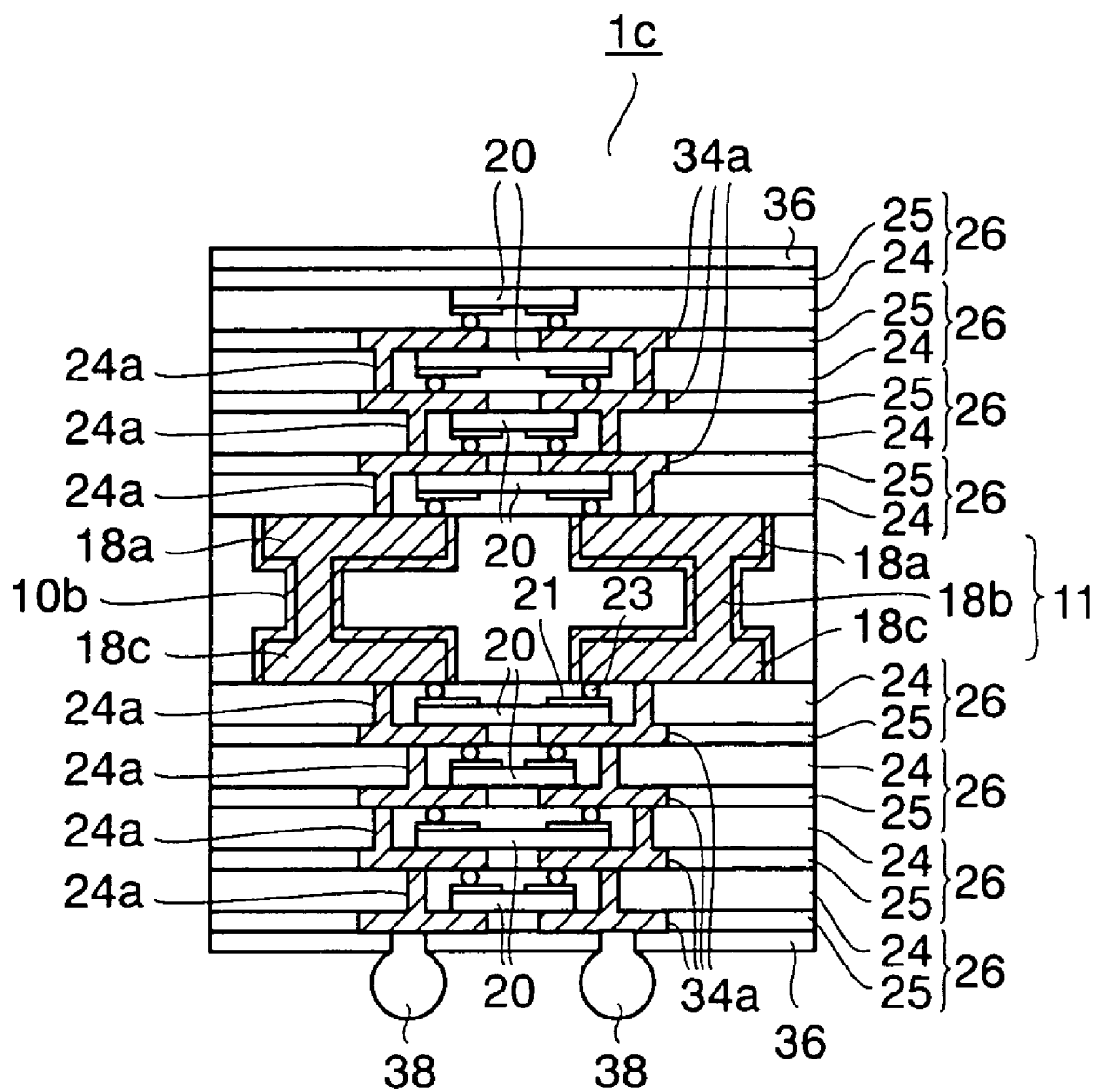
FIG. 5 is a sectional view showing a semiconductor device manufacturing method according to a fourth embodiment of the present invention.

FIG. 5 is a sectional view showing a semiconductor device manufacturing method according to a fourth embodiment of the present invention. The fourth embodiment provides the mode that a plurality of semiconductor chips are laminated on both surfaces of the wiring substrate and packaged respectively. In FIG. 5, the same reference numbers are affixed to the same elements as those in FIG. 3O, and their detailed explanation will be omitted herein.

As shown in FIG. 5, a semiconductor device 1c of the fourth embodiment shows the mode that a plurality of semiconductor chips are also laminated on the back surface (surface on which the bumps 38 are mounted) side of the wiring substrate 11 in the semiconductor device 1a of the second embodiment (FIG. 3O). In other words, wiring patterns 18c are also formed on the back surface side of the wiring substrate 11 of the fourth embodiment. These wiring patterns 18c are connected electrically to the wiring patterns 18a on the surface side via the conductive plugs 18b that are filled in the through holes 10b of the wiring substrate 11.

Then, the bumps 23 of the semiconductor chips 20 are bonded to the wiring patterns 18c on back surface side by the flip-chip bonding. In addition, the wiring patterns 34a are formed on the back surface side of the semiconductor chips 20. These wiring patterns 34a are connected electrically to the connection pads 21 on the element formation surface side via the via holes 24a formed in the first insulating film 24. A plurality of semiconductor chips 20 having such structure are laminated three-dimensionally and connected mutually in the state that the semiconductor chips 20 are buried in the interlayer insulating film 26.

According to the semiconductor device 1c of the fourth embodiment, since a plurality of thinned semiconductor chips 20 are laminated on both surfaces of the wiring substrate 11 and packaged respectively, the packaging density can be improved higher than the first to third embodiments.

In this case, while the mode in which a plurality of semiconductor chips 20 are laminated on both surfaces of the wiring substrate 11 by applying the packaging method of the second embodiment is shown, the mode in which a plurality of semiconductor chips 20 are laminated on both surfaces of the wiring substrate 11 by applying the packaging method of the first embodiment may be employed.

Also, such a mode may be employed that, in the semiconductor device 1b of the third embodiment (FIG. 4C), the substrate, the wiring patterns formed on both surfaces of which are connected mutually via the through holes, is employed as the wiring substrate 11b, and that a plurality of semiconductor chips 20 connected electrically to the wiring patterns are laminated on the surface of the wiring substrate 11b on which the semiconductor chips 20 are not mounted.

Fifth Embodiment

FIG. 6A to FIG. 6F are sectional views showing a semiconductor device manufacturing method according to a fifth embodiment of the present invention. The fifth embodiment provides the mode that a metal plate having predetermined wiring patterns (connection pads) thereon is employed as the wiring substrate and that a plurality of semiconductor chips connected to the wiring patterns of the metal plate are laminated and packaged by applying the packaging method of the first or second embodiment and then only the metal plate is removed selectively. In this case, detailed explanations of the same elements and the same steps as those in other embodiments will be omitted herein.

Figure 6A:
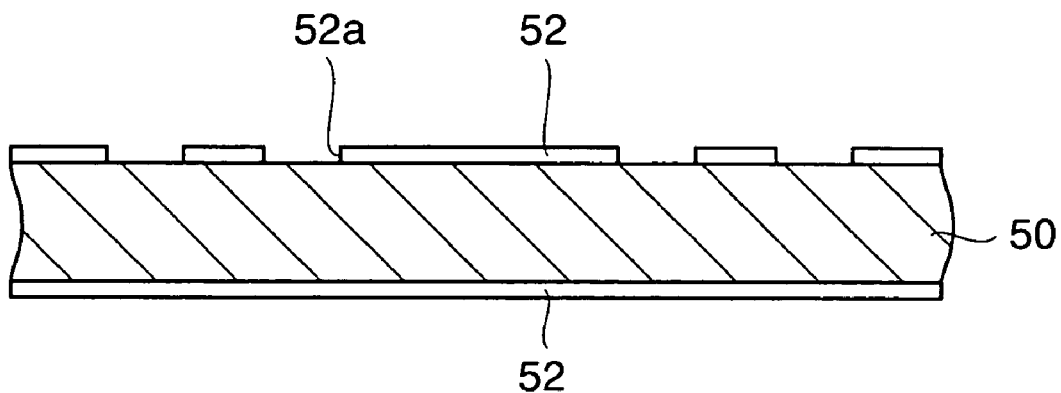
FIG. 6A to FIG. 6F are sectional views showing a semiconductor device manufacturing method according to a fifth embodiment of the present invention.

In the semiconductor device manufacturing method according to the fifth embodiment, as shown in FIG. 6A, first a metal plate 50 made of copper, or the like is prepared. Then, a resist film 52 having opening portions 52a at portions, on which the wiring patterns are formed, is formed on one surface of the metal plate 50 by the photolithography. At this time, the other surface of the metal plate 50 is covered with the resist film 52.

Figure 6B:
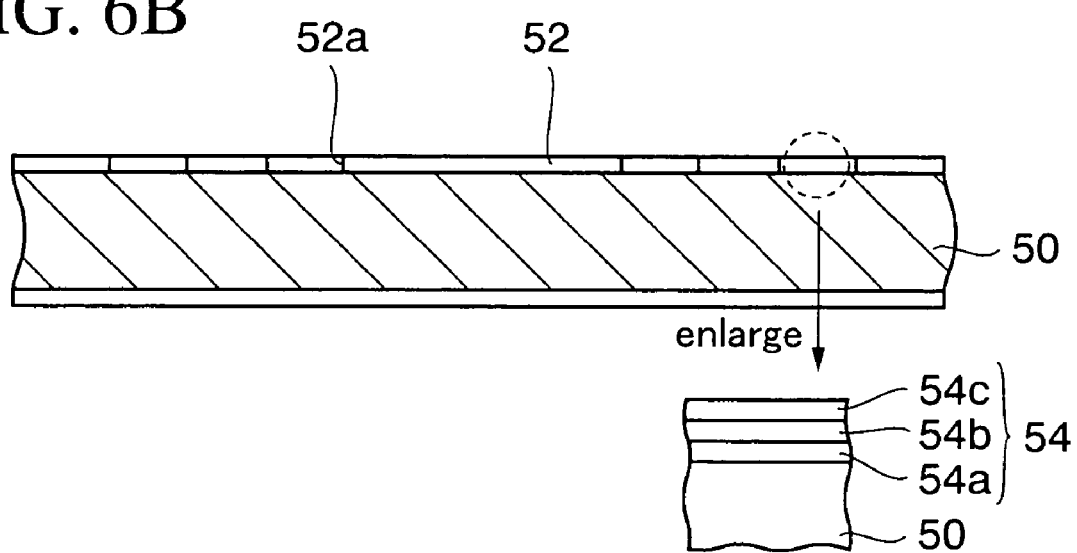
Figure 6C:
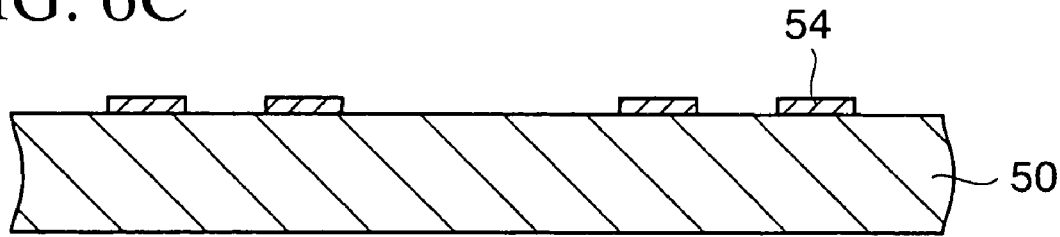

Then, as shown in FIG. 6B, a gold layer 54a, a nickel layer 54b, and a gold layer 54c are formed sequentially in the opening portions 52a by the electroplating using the metal plate 50 as the plating power-supply layer while using the resist film 52 as a mask. Then, the resist film 52 is removed. Thus, as shown in FIG. 6C, wiring patterns (connection pads) 54 each consisting of the gold layer 54a, the nickel layer 54b, and the gold layer 54c are formed on the metal plate 50.

Figure 6D:
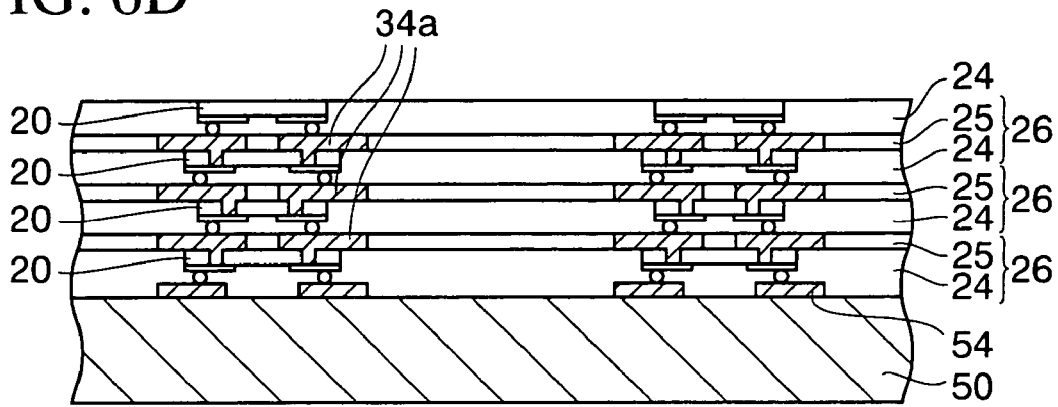

Then, as shown in FIG. 6D, according to the packaging method similar to the first embodiment, a plurality of semiconductor chips 20 connected electrically to the wiring patterns 54 on the metal plate 50 are packaged. In this case, the semiconductor chips 20 may be packaged by using the packaging method of the second embodiment.

Figure 6E:
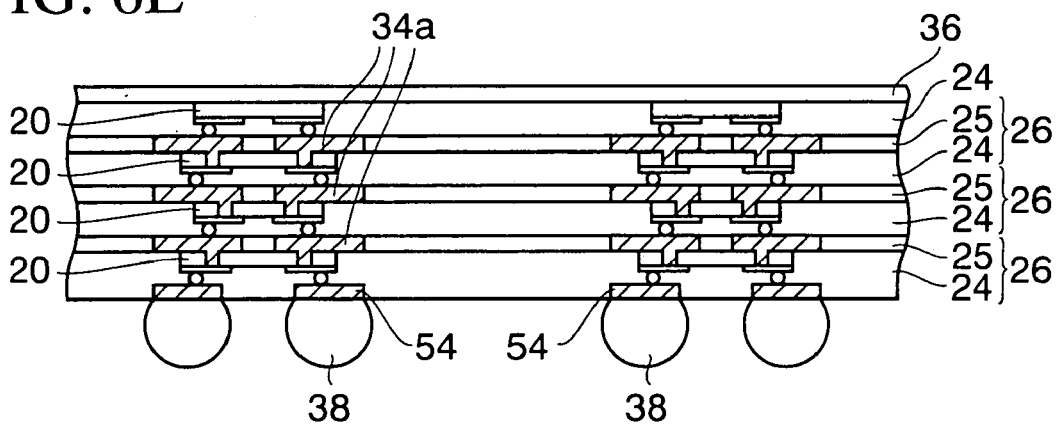

Then, as shown in FIG. 6E, the passivation film 36 for covering the uppermost semiconductor chips 20 is formed. Then, the metal plate 50 is selectively etched with respect to the wiring patterns 54 and the first insulating film 24 and removed. For example, if the metal plate 50 is formed of copper, the metal plate 50 can be etched selectively with respect to the wiring patterns (gold layer/nickel layer/gold layer) 54 and the first insulating film (resin film) 24 by the wet etching using an iron (III) chloride aqueous solution, a copper (II) chloride aqueous solution, an ammonium peroxide aqueous solution, or the like and can be removed. Thus, the wiring patterns 54 connected to the semiconductor chips 20 are exposed from the lower surface of the first insulating film 24.

Figure 6F:
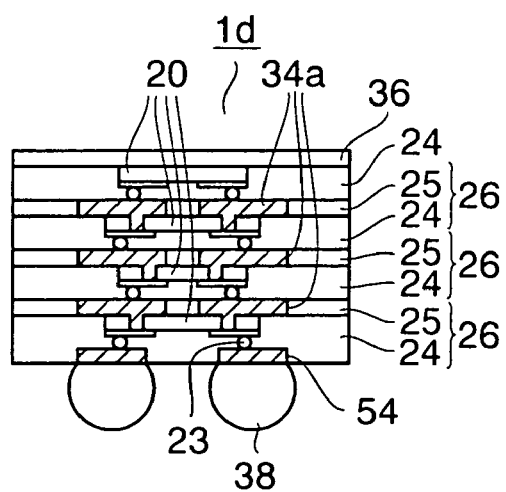

Then, the bumps 38 connected to the wiring patterns 54, which are exposed by removing the metal plate 50, are formed. Then, as shown in FIG. 6F, like the first embodiment, a semiconductor device 1d of the fifth embodiment having the stacked CSP structure is completed by dividing a plurality of structural bodies in FIG. 6E individually.

In the semiconductor device 1d manufactured in this manner, the bumps 23 of the lowermost semiconductor chips 20 out of a plurality of laminated semiconductor chips 20 are bonded to the upper surfaces of the wiring patterns 54, the lower surfaces of which are connected to the bumps 38 and which are buried in the first insulating film 24, by the flip-chip bonding. Then, the semiconductor chips 20 except the lowermost semiconductor chips 20 are bonded to the wiring patterns 34a, which are formed on the back surface side of the underlying semiconductor chips 20 respectively, by the flip-chip bonding. In this manner, a plurality of semiconductor chips 20 that are laminated three-dimensionally are connected mutually via the via holes 20a formed in the semiconductor chips 20.

The semiconductor device 1d of the fifth embodiment can achieve the same advantages as the first embodiment. Also, since the wiring substrate is not provided, the thickness of the semiconductor device can be reduced correspondingly thinner than the semiconductor device having the wiring substrate in other embodiments.

Sixth Embodiment

FIG. 7A to FIG. 7G are sectional views showing a semiconductor device manufacturing method according to a sixth embodiment of the present invention. Different points of the sixth embodiment from the fifth embodiment reside in that not only the wiring patterns are formed on the metal plate but also the bumps connected to the wiring patterns are formed in advance in the metal plate. In this case, detailed explanations of the same elements and the same steps as those in other embodiments will be omitted herein.

Figure 7A:
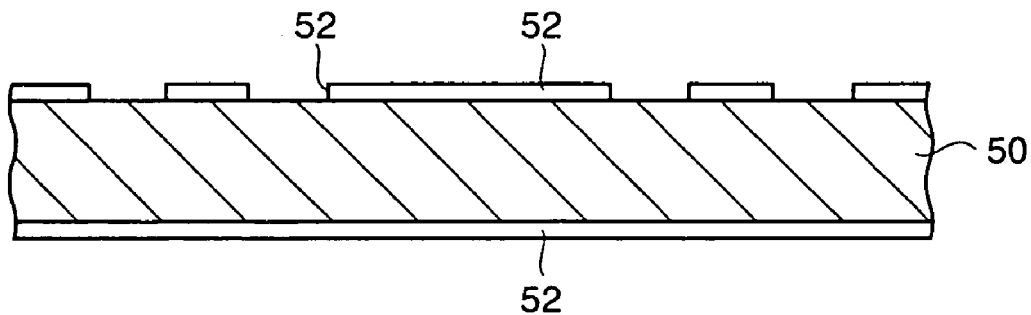
FIG. 7A to FIG. 7G are sectional views showing a semiconductor device manufacturing method according to a sixth embodiment of the present invention.

In the semiconductor device manufacturing method according to the sixth embodiment, as shown in FIG. 7A, according to the similar method to the fifth embodiment, first the resist film 52 having the opening portions 52a used to form the wiring patterns on one surface of the metal plate 50 made of copper is patterned, and the other surface is covered with the resist film 52.

Figure 7B:
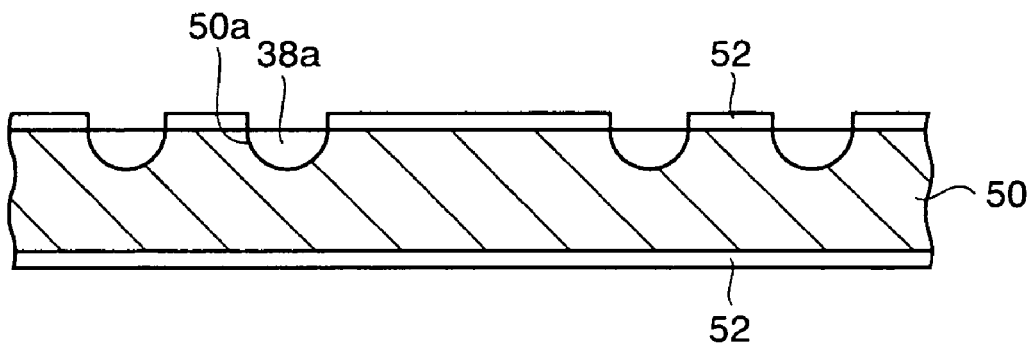

Then, as shown in FIG. 7B, concave portions 50a are formed by etching the exposed portions of the metal plate 50 while using the resist film 52 as a mask. Then, the solder plating is applied to inner portions of the concave portions 50a on the metal plate 50 by the electroplating using the metal plate 50 as the plating power-supply layer, while using the resist film 52 as a mask. Thus, solder layers 38a are formed.

Figure 7C:
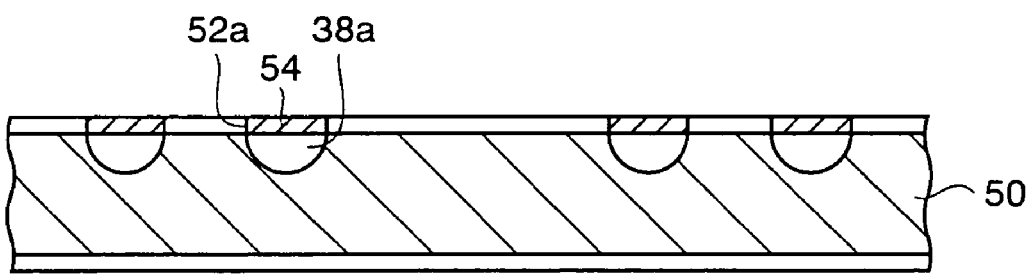
Figure 7D:
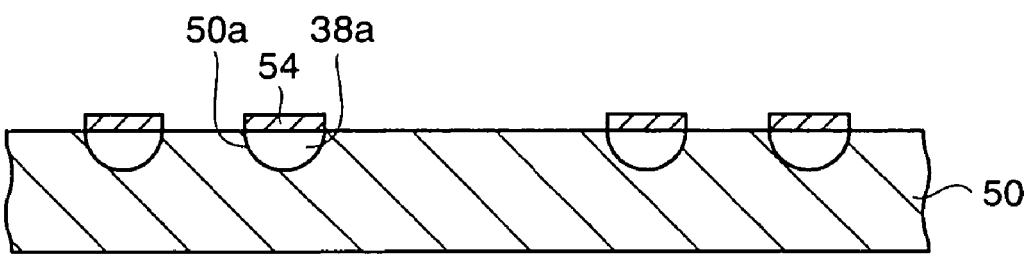

Then, as shown in FIG. 7C, according to the same method as the above electroplating, the wiring patterns 54 made of the laminated film (gold layer/nickel layer/gold layer) similar to the fifth embodiment are formed in the opening portions 52a in the resist film 52. Then, the resist film 52 is removed. Accordingly, as shown in FIG. 7D, the solder layers 38a are filled in the concave portions 50a on the metal plate 50, so that the wiring patterns 54 formed and connected to the solder layers 38a are obtained. The solder layers 38a are formed as the bumps by the post steps.

Figure 7E:
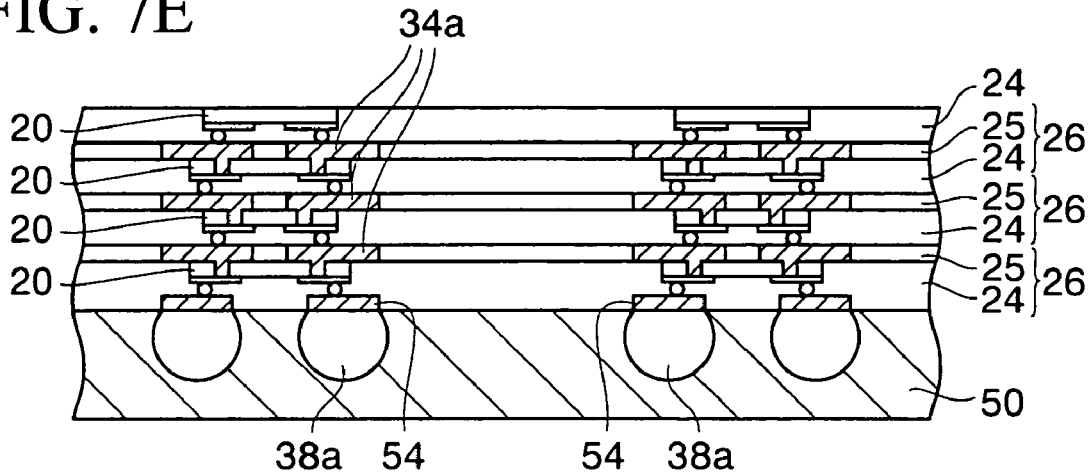

Then, as shown in FIG. 7E, according to the packaging method similar to the first embodiment, a plurality of semiconductor chips 20 connected electrically to the wiring patterns 54 on the metal plate 50 are packaged. In this case, the semiconductor chips 20 may be packaged by applying the packaging method similar to the second embodiment.

Figure 7F:
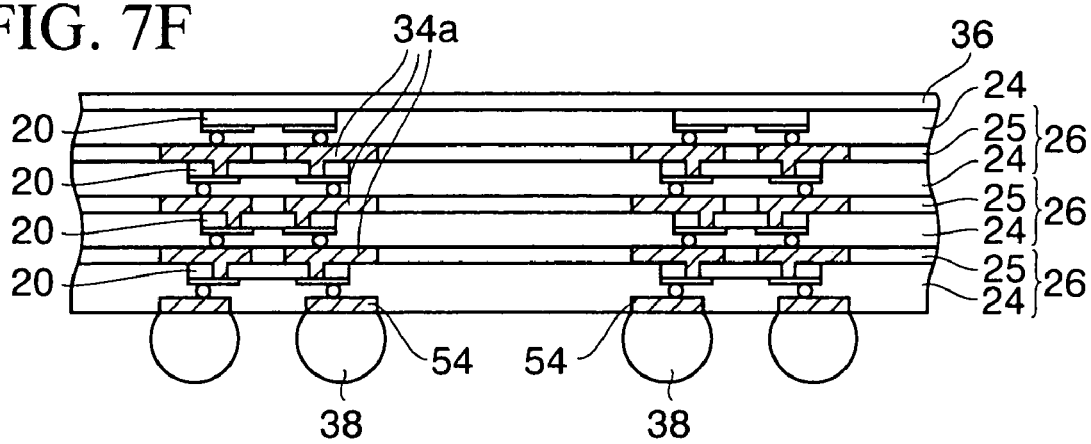

Then, as shown in FIG. 7F, the passivation film 36 for covering the uppermost semiconductor chips 20 is formed. Then, the metal plate 50 is selectively etched with respect to the solder layers 38a and the first insulating film 24 and removed. For example, if the metal plate 50 is formed of copper, the metal plate 50 can be removed selectively with respect to the solder layers 38a and the first insulating film (resin film) 24 by using the wet etchant similar to the fifth embodiment. As a result, the solder layers 38a are exposed to act as the bumps 38.

Figure 7G:
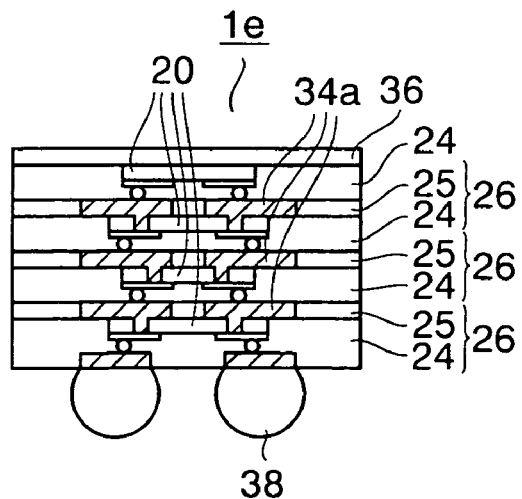

Then, as shown in FIG. 7G, like the first embodiment, a semiconductor device 1e of the sixth embodiment having the stacked CSP structure is completed by dividing a plurality of structural bodies in FIG. 7F individually.

The sixth embodiment can achieve the same advantages as the first embodiment. Also, since the wiring substrate is not provided like the fifth embodiment, the thickness of the semiconductor device can be reduced rather than other embodiments.

With the above, the present invention is explained in detail with reference to the first to sixth embodiments. The scope of the present invention is not limited to modes shown particularly in the above embodiments. It should be interpreted that variations of the above embodiments without departing from the range of the gist of the invention are contained in the scope of the present invention.

For example, in the first embodiment, like the third embodiment, the mode that the wiring patterns 18a of the wiring substrate 11 made of the silicon substrate 10 are connected to the bumps 38 mounted on the passivation film 36 side via the via holes formed in the interlayer insulating film 26 may be employed.

What is claimed is:

1. A semiconductor device manufacturing method comprising the steps of:
   preparing a wiring substrate including a wiring pattern on a surface;
   bonding a connection terminal of an electronic chip, which has a predetermined element and the connection terminal on one surface, to the wiring pattern of the wiring substrate by a flip-chip bonding;
   forming a first insulating film on the wiring substrate, the first insulating film having a film thickness that covers the electronic chip, or a film thickness that exposes at least another surface of the electronic chip;
   reducing a thickness of the electronic chip by grinding the first insulating film and said another surface of the electronic chip;
   forming a via hole having a depth, which reaches the connection terminal on said one surface of the electronic chip from a predetermined portion on said another surface of the electronic chip, in the electronic chip;
   forming a second insulating film on the electronic chip and the first insulating film without filling up the via hole:
   forming a wiring recess, which communicates with the via hole, by etching a predetermined portion of the second insulating film containing a portion that corresponds to the via hole; and
   forming a conductive film pattern, which is electrically connected to the connection terminal via the via hole, by filling a conductive film in the via hole and the wiring recess.

2. A semiconductor device manufacturing method according to claim 1, wherein the step of reducing a thickness of the electronic chip is the step of grinding by a grinder, or the step of grinding by the grinder and then polishing by CMP.

3. A semiconductor device manufacturing method according to claim 1, wherein, in the step of reducing a thickness of the electronic chips, a grinding surface of the electronic chip and an upper surface of the first insulating film are planarized at an almost same height.

4. A semiconductor device manufacturing method according to claim 1, after the step of forming the conductive film pattern, further comprising the step of:
   laminating three-dimensionally and packaging a plurality of electronic chips on the wiring substrate, based on n-times (n is an integer of 1 or more) repetition of a series of steps from the step of bonding the electronic chip by the flip-chip bonding to the step of forming the conductive film pattern connected to the connection terminal via the via hole.

5. A semiconductor device manufacturing method according to claim 1, wherein the wiring substrate has an alignment mark that is formed simultaneously with the conductive film pattern, and
   a portion in which the via hole of the electronic chip is formed is identified based on recognition of the alignment mark, in the step of forming the via hole in the electronic chip.

6. A semiconductor device manufacturing method according to claim 1, wherein, in the step of forming the via hole in the electronic chip, a portion in which the via hole of the electronic chip is formed is identified based on recognition of a predetermined pattern on one surface of the electronic chip executed by irradiating X-rays, infrared rays or visible rays from another surface of the electronic chip to transmit there through.

7. A semiconductor device manufacturing method according to claim 1, wherein, in the step of reducing a thickness of the electronic chip, the thickness of the electronic chip is about 150 μm or less.

8. A semiconductor device manufacturing method according to claim 4, after the step of laminating three-dimensionally and packaging a plurality of electronic chips on the wiring substrate, further comprising the step of:
   forming a passivation film on or over uppermost electronic chip in the plurality of electronic chips.

9. A semiconductor device manufacturing method according to claim 8, wherein a conductive plug that is connected to the wiring pattern and filled in a through hole which passes through the wiring substrate, is formed in the wiring substrate, and
   after the step of laminating three-dimensionally and packaging a plurality of electronic chips on the wiring substrate, further comprising the step of:
   forming a bump that is connected to the conductive plug exposed from an opposite surface of the wiring substrate to a surface on which the wiring pattern is formed.

10. A semiconductor device manufacturing method according to claim 8, after the step of forming the passivation film, further comprising the steps of:
    forming a via hole that exposes a part of the wiring pattern, by etching a plurality of interlayer insulating films each consisting of the first insulating film and the second insulating film, and the passivation film, on an area which is over the wiring pattern and on the area on which the electronic chip is not mounted;

forming a conductive plug in the via hole; and forming a bump connected to the conductive plug.

11. A semiconductor device manufacturing method according to claim 8, wherein the wiring substrate is a metal plate including the wiring pattern on a surface, and after the step of forming the passivation film, further comprising the steps of:

exposing the wiring pattern by selectively etching the metal plate with respect to the wiring pattern and the first insulating film to remove; and forming a bump connected to the wiring pattern.

12. A semiconductor device manufacturing method according to claim 8, wherein the wiring substrate is a metal plate including a solder layer filled in concave portions provided to the metal plate, and the wiring pattern formed on the solder layer, and after the step of forming the passivation film, further comprising the step of:

forming a bump by selectively etching the metal plate with respect to the solder layer and the first insulating film to remove and to expose the solder layer.

13. A semiconductor device manufacturing method according to claim 9, wherein a structural body in which the electronic chip is laminated and packaged is formed in plural areas of the wiring substrate, and before or after the step of forming the bump, further comprising the step of:

dividing the wiring substrate such that the structural body in which the electronic chip is laminated and packaged is contained by a predetermined number.

14. A semiconductor device manufacturing method comprising the steps of:

preparing a wiring substrate including a wiring pattern on a surface;

bonding a connection terminal of an electronic chip, which has a predetermined element and the connection terminal on one surface, to the wiring pattern of the wiring substrate by a flip-chip bonding;

forming a first insulating film on the wiring substrate, the first insulating film having a film thickness that covers the electronic chip, or a film thickness that exposes at least another surface of the electronic chip;

reducing a thickness of the electronic chip by grinding the first insulating film and said another surface of the electronic chip;

forming a via hole having a depth, which reaches the conductive film pattern of the wiring substrate from an upper surface of a predetermined portion of the first insulating film, in the first insulating film;

forming a second insulating film on the electronic chip and the first insulating film without filling up the via hole;

forming a wiring recess, which communicates with the via hole, by etching a predetermined portion of the second insulating film containing a portion that corresponds to the via hole; and forming a conductive film pattern, which is connected to the wiring pattern of the wiring substrate via the via hole, by filling a conductive film in the via hole and the wiring recess.

15. A semiconductor device manufacturing method according to claim 14, after the step of forming the conductive film pattern, further comprising the step of:

laminating three-dimensionally and packaging a plurality of electronic chips on the wiring substrate, based on n-times (n is an integer of 1 or more) repetition of a series of steps from the step of bonding the electronic chip by the flip-chip bonding to the step of forming the conductive film pattern connected to the wiring pattern of the wiring substrate via the via hole.

* * * * *